(12) United States Patent
Wang et al.

(10) Patent No.: US 10,277,147 B2
(45) Date of Patent: Apr. 30, 2019

(54) TRIBOELECTRIC NANOGENERATORS BASED ON CHEMICALLY TREATED CELLULOSE

(71) Applicants: Wisconsin Alumni Research Foundation, Madison, WI (US); The United States of America as Represented by the Secretary of Agriculture, Washington, DC (US)

(72) Inventors: Xudong Wang, Middleton, WI (US); Zhiyong Cai, Madison, WI (US); Chunhua Yao, Madison, WI (US); Alberto Hernandez, Baltimore, MD (US); Yanhao Yu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 323 days.

(21) Appl. No.: 15/178,285

(22) Filed: Jun. 9, 2016

(65) Prior Publication Data

US 2017/0359001 A1    Dec. 14, 2017

(51) Int. Cl.

| H02N 1/04 | (2006.01) |
| B29C 43/02 | (2006.01) |
| B29C 65/00 | (2006.01) |
| C23C 16/455 | (2006.01) |
| C23C 16/30 | (2006.01) |
| B29K 1/00 | (2006.01) |
| B29L 31/34 | (2006.01) |

(52) U.S. Cl.
CPC .............. *H02N 1/04* (2013.01); *B29C 43/02* (2013.01); *B29C 65/00* (2013.01); *C23C 16/30* (2013.01); *C23C 16/45525* (2013.01); *B29K 2001/08* (2013.01); *B29K 2995/0026* (2013.01); *B29L 2031/34* (2013.01)

(58) Field of Classification Search
CPC ....................................................... H02N 1/04
See application file for complete search history.

(56) References Cited

U.S. PATENT DOCUMENTS

| 4,990,813 A * | 2/1991 | Paramo ..................... H02N 1/04 |
| | | 310/308 |
| 5,940,054 A | 8/1999 | Harris |
| 9,178,446 B2 * | 11/2015 | Wang ....................... H02N 1/04 |

(Continued)

FOREIGN PATENT DOCUMENTS

EP    2975759    1/2016

OTHER PUBLICATIONS

Yu et al., Sequential Infiltration Synthesis of Doped Polymer Films with Tunable Electrical Properties for Efficient Triboelectric Nanogenerator Development, Adv. Mater. 2015, 27, Jul. 15, 2015, pp. 4938-4944.

(Continued)

*Primary Examiner* — Robert W Horn
(74) *Attorney, Agent, or Firm* — Bell & Manning, LLC

(57) ABSTRACT

Triboelectric nanogenerators that operate in a vertical contact separation mode and methods for fabricating the triboelectric generators are provided. Also provided are methods for using the triboelectric nanogenerators to harvest mechanical energy and convert it into electric energy. In the TENGs, one or both of the triboelectrically active layers comprises a cellulose that has been chemically treated to alter its electron affinity.

29 Claims, 11 Drawing Sheets

(56) References Cited

U.S. PATENT DOCUMENTS

| | | | | |
|---|---|---|---|---|
| 9,543,860 | B2* | 1/2017 | Wang | H02N 1/04 |
| 9,584,002 | B2* | 2/2017 | Morita | H01L 41/125 |
| 9,762,151 | B2* | 9/2017 | Zhang | H02N 11/002 |
| 9,790,928 | B2* | 10/2017 | Wang | H02N 1/04 |
| 9,812,993 | B2* | 11/2017 | Wang | H02N 1/04 |
| 9,968,129 | B2* | 5/2018 | Sebastian | A24F 15/18 |
| 2011/0050181 | A1* | 3/2011 | Post | H02N 1/04 320/166 |
| 2014/0246951 | A1 | 9/2014 | Wang et al. | |
| 2014/0292138 | A1* | 10/2014 | Wang | H02N 1/04 310/300 |
| 2014/0338458 | A1 | 11/2014 | Wang et al. | |
| 2015/0035408 | A1* | 2/2015 | Despesse | H02N 1/08 310/310 |
| 2015/0303831 | A1* | 10/2015 | Kwon | H02N 11/002 310/300 |
| 2016/0028327 | A1* | 1/2016 | Aliane | B05D 3/065 310/300 |
| 2016/0036351 | A1* | 2/2016 | Kim | H02N 1/04 73/514.32 |
| 2016/0149518 | A1* | 5/2016 | Wang | H02N 1/04 310/310 |
| 2016/0233792 | A1* | 8/2016 | Park | H02N 1/04 |
| 2016/0344307 | A1* | 11/2016 | Liu | H02N 1/04 |
| 2017/0063256 | A1* | 3/2017 | Wu | H02N 1/04 |
| 2017/0067207 | A1* | 3/2017 | Malkki | A61L 15/28 |
| 2017/0214338 | A1* | 7/2017 | Otagiri | H02N 1/04 |
| 2017/0236990 | A1* | 8/2017 | Park | H02N 1/04 310/306 |
| 2017/0317609 | A1* | 11/2017 | Kim | H02N 1/04 |
| 2017/0331397 | A1* | 11/2017 | Kim | H02N 1/04 |
| 2017/0353043 | A1* | 12/2017 | Olah | H02J 7/32 |
| 2017/0359001 | A1* | 12/2017 | Wang | H02N 1/04 |
| 2018/0006582 | A1* | 1/2018 | Kim | H02N 1/04 |
| 2018/0013359 | A1* | 1/2018 | Park | H02N 1/04 |
| 2018/0062543 | A1* | 3/2018 | Jung | H02N 1/04 |

OTHER PUBLICATIONS

Zi et al., Standards and figure-of-merits for quantifying the performance of triboelectric nanogenerators, Nature Communications | 6:8376, Sep. 25, 2015, pp. 1-8.

Lin et al., Noncontact Free-Rotating Disk Triboelectric Nanogenerator as a Sustainable Energy Harvester and Self-Powered Mechanical Sensor, ACS Appl. Mater. Interfaces 2014, 6, Jan. 27, 2014, pp. 3031-3038.

ZL Wang, Triboelectric nanogenerators as new energy technology and self-powered sensors—Principles, problems and perspectives, Faraday Discuss. DOI: 10.1039/c4fd00159a, Sep. 8, 2014.

Zhang et al., Cellulose Nanofi brils: From Strong Materials to Bioactive Surfaces, J. Renew. Mater., vol. 1, No. 3, May 22, 2013, pp. 195-211.

Wang et al., Progress in triboelectric nanogenerators as a new energy technology and self-powered sensors, Energy Environ. Sci., 2015, 8, Jun. 18, 2015, pp. 2250-2282.

The TriboElectric Series, https://www.trifield.com/content/triboelectric-series/, Printed on Apr. 29, 2016, pp. 1-2.

* cited by examiner

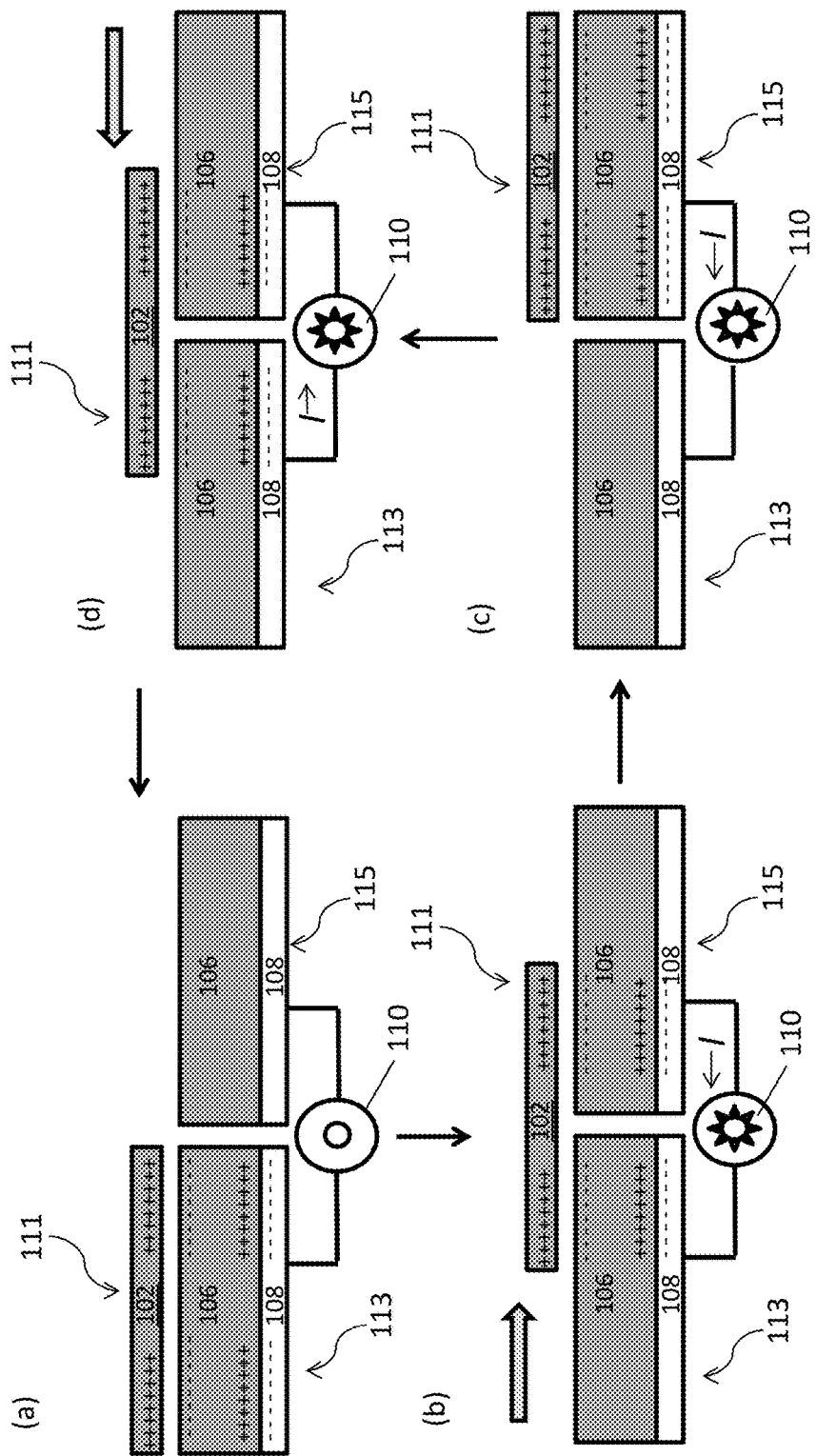

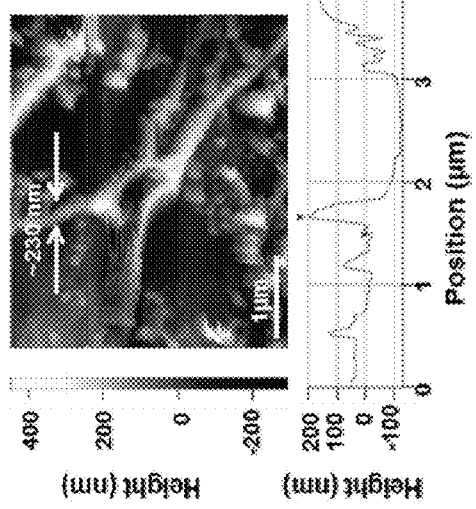
FIG. 3
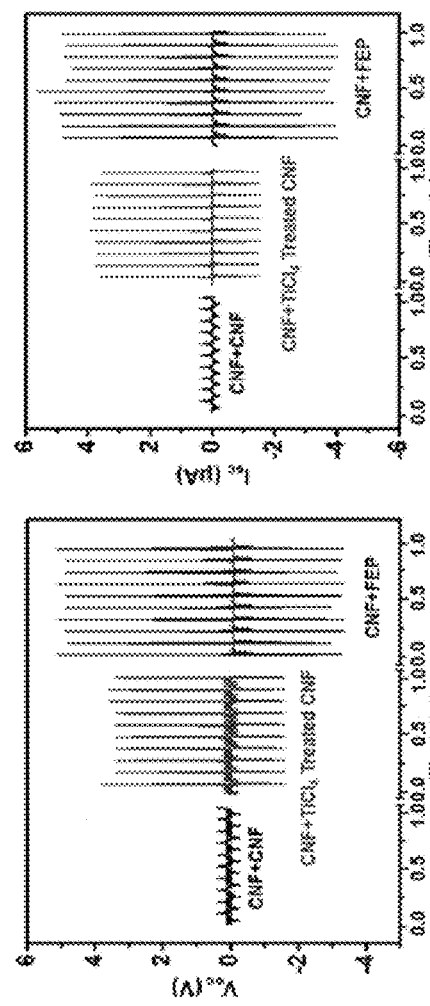
FIG. 4A
FIG. 4B

TRIBOELECTRIC NANOGENERATORS BASED ON CHEMICALLY TREATED CELLULOSE

REFERENCE TO GOVERNMENT RIGHTS

This invention was made with government support under 14-JV-11111124-029 awarded by the USDA/FS and DE-SC0008711 awarded by the US Department of Energy. The government has certain rights in the invention.

BACKGROUND

Mechanical energy from the environment (e.g. ambient vibrations or activities of the human body) represents a unique and sustainable energy source suited for powering portable electronics and unattended devices. In 2012, the triboelectric nanogenerator (TENG) was first reported as a new type of technology that converts environmental mechanical energy into electrical energy. (See, F.-R. Fan, Z.-Q. Tian, Z. Lin Wang, Nano Energy 2012, 1, 328 and F. R. Fan, J. Luo, W. Tang, C. Li, C. Zhang, Z. Tian, Z. L. Wang, Journal of Materials Chemistry A 2014, 2, 13219.) Compared to other technologies, TENGs are advantageous in terms of their high efficiencies, high power densities, light weight, low cost, and manufacturability. A TENG functions under the coupling effects of contact electrification and electrostatic induction. The working principle requires two dissimilar surfaces to be oppositely charged upon contact. The common positive materials in TENGs are polyamides, metals, indium tin oxide (ITO), and zinc oxide. Common negative materials include fluorinated ethylene propylene (FEP), polytetrafluoroethylene (PTFE) and polyvinylidene fluoride (PVDF), polydimethylsiloxane (PDMS), and polyethylene terephthalate (PET). The positive and negative materials are used in pairs in TENGs due to their opposite tendencies to gain or lose charges upon contact.

SUMMARY

TENGs and methods for fabricating the TENGs are provided. Also provided are methods for using the TENGs to harvest mechanical energy and convert it into electric energy.

One embodiment of a triboelectric nanogenerator comprises: a first electrode comprising a positive active layer comprising cellulose, the positive active layer having a front surface with a positive surface charge and an oppositely facing back surface; a second electrode comprising a negative active layer comprising cellulose, the negative active layer having a front surface with a negative surface charge and an oppositely facing back surface; optionally, a third electrode comprising a third active layer that is either a positive active layer comprising cellulose or a negative active layer comprising cellulose, the third active layer having a front surface with a positive surface charge, if it is a positive active layer, or a negative surface change, if it is a negative active layer, and an oppositely facing back surface; wherein the positive active layer, the negative active layer, and, if present, the third active layer are dielectric layers; a first electrically conducting contact layer on the back surface of one of the positive active layer, the negative active layer, or, if present, the third active layer; a second electrically conducting contact layer on the back surface of another of the positive active layer, the negative active layer, or, if present, the third active layer; and an external load connected across the first and second electrically conducting contact layers, such that the first and second electrically conducting contact layers are in electrical communication through the external load. The front surface of each of the positive active layer, the negative active layer, and, if present, the third active layer is disposed opposite and facing the front surface of at least one other of the positive active layer, the negative active layer, and, if present, the third active layer. Also, the positive active layer, the negative active layer, and, if present, the third active layer are configured to be moved with respect to one another in a periodic manner that generates a periodically varying electric potential difference between the first electrically conducting contact layer and the second electrically conducting contact layer. The cellulose of at least one of the positive active layer, the negative active layer, and, if present, the third active layer comprises a chemical functional group that provides the negative and positive active layers with different electron affinities.

For example, a triboelectric nanogenerator may comprise: a positive active layer comprising cellulose, the positive active layer having a front surface and an oppositely facing back surface; a first electrically conducting contact layer on the back surface of the positive active layer; a negative active layer comprising cellulose, the negative active layer having a front surface and a back surface, wherein the negative active layer has a higher electron affinity than the positive active layer; a second electrically conducting contact layer on the back surface of the negative active layer; and an external load connected across the first and second contact layers, such that the first and second contact layers are in electrical communication through the external load. In the triboelectric nanogenerator, the cellulose of at least one of the positive and negative active layers comprises a chemical functional group that provides the negative and positive active layers with different electron affinities. The front surface of the positive active layer is disposed opposite and facing the front surface of the negative active layer and the positive and negative active layers are configured to be moved with respect to one another in a periodic manner that generates a periodically varying electric potential difference between the first contact layer and the second contact layer.

One embodiment of a method of converting mechanical energy into an electrical current using a triboelectric nanogenerator as described herein includes the steps of: (a) bringing the front surface of the positive active layer into contact with the front surface of the negative active layer, wherein electrons from the positive active layer are injected into the negative active layer, such that a positive surface charge accumulates on the positive active layer and a negative surface charge accumulates on the negative active layer; (b) applying a force to at least one of the positive and negative active layers that moves the front surface of the positive active layer with respect to the front surface of the negative active layer in a manner that generates a potential difference between the first and second contact layers, wherein electrons are transferred from either the first or the second contact layer, through the external load, and to the other contact layer until the potentials of the first and second contact layers become equal; (c) applying a reverse force to at least one of the positive and negative active layers that moves the front surface of the positive active layer with respect to the front surface of the negative active layer in a manner that regenerates a potential difference between the first and second contact layers, wherein electrons are transferred back from either the first or the second contact layer, through the external load, and to the other contact layer until the potentials of the first and second electrodes become equal; and (d) repeating steps (b) and (c) a plurality of times.

One embodiment of a method of making a triboelectric nanogenerator comprises the step of forming a first electrode by: forming a first active layer comprising cellulose on a substrate, the first active layer having a front surface and an oppositely facing back surface; functionalizing the cellulose of the first active layer with one or more chemical functional groups that change the electron affinity of the cellulose relative to that of unfunctionalized cellulose; and forming a first contact layer on the back surface of the first active layer. The method further comprising the step of forming a second electrode by: forming a second active layer comprising cellulose on a substrate, the second active layer having a front surface and an oppositely facing back surface, wherein the cellulose of the second active layer has a different electron affinity than the cellulose of the first active layer; and forming a second contact layer on the back surface of the second active layer. The method still further comprising the step of arranging the first active layer and the second active layer such that the front surface of the first active layer is disposed opposite and facing the front surface of the second active layer and the first and second active layers are configured to be moved with respect to one another in a periodic manner that generates a periodically varying electric potential difference between the first contact layer and the second contact layer.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1C. Schematic diagram showing a lateral force being applied to the mobile triboelectric layer of a free-standing triboelectric layer mode TENG.

FIG. 3. Atomic force microscopy (AFM) topography image of a CNF film surface.

FIG. 4A. The open circuit voltage (Voc) (c) measured from CNF film-based TENGs built with different pairs of active materials. FIG. 4B. The short circuit current (Isc) measured from CNF film-based TENGs built with different pairs of active materials.

DETAILED DESCRIPTION

Figure 1A:
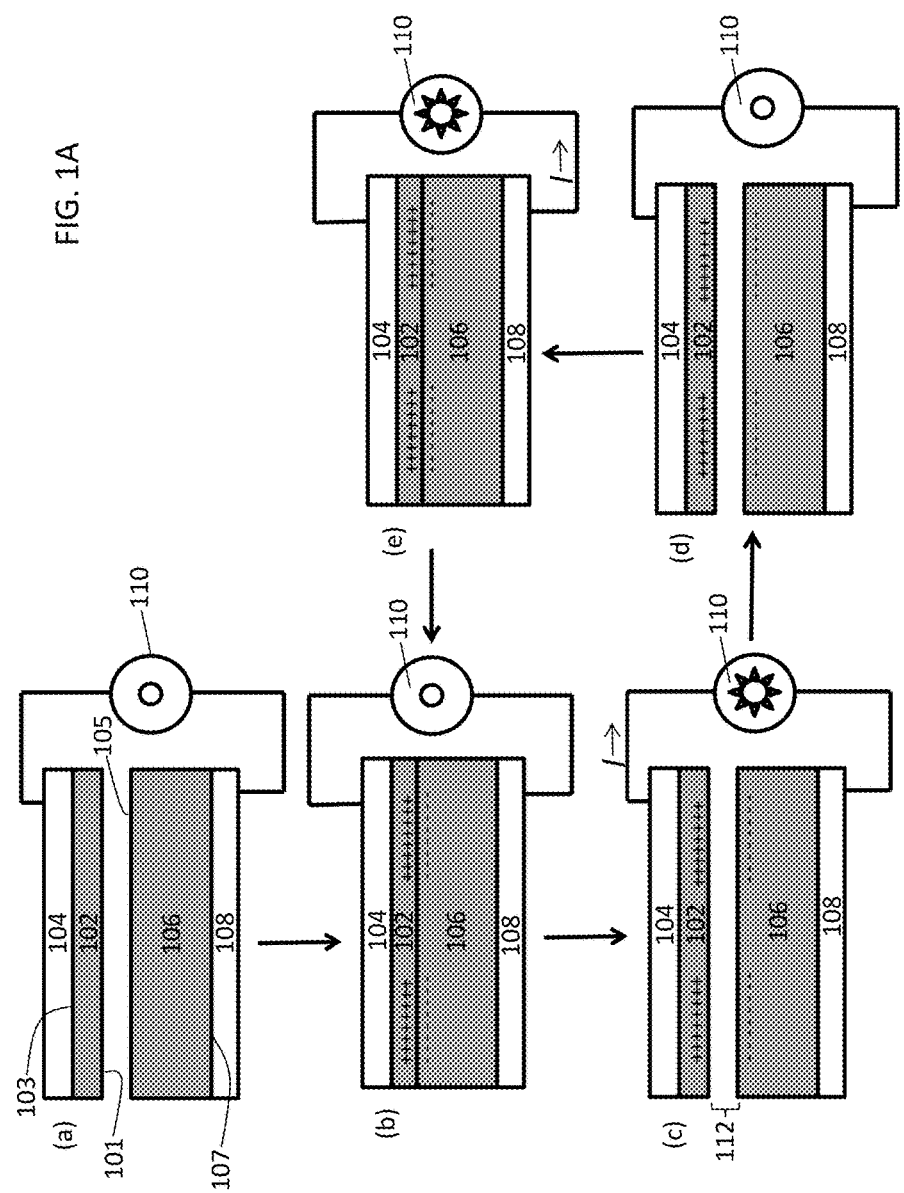
FIG. 1A. Schematic diagram showing a cyclic compressive force being applied to a vertical contact mode TENG.

TENGs and methods for fabricating the TENGs are provided. Also provided are methods for using the TENGs to harvest mechanical energy and convert it into electric energy.

In the TENGs, one or both of the triboelectrically active layers comprises a cellulose that has been chemically treated to alter its electron affinity. As a result, TENGs in which both triboelectrically active layers comprise a cellulose material can be fabricated. This is advantageous because cellulose is a readily available, inexpensive, and biodegradable material derived from a renewable resource. The nanogenerators can be used to convert mechanical energy into electric current for a variety of applications. For example, the TENGs can be used to drive small electronics, charge batteries and capacitors, and drive chemical reactions. Because they can have small, flexible, and light weight designs, the TENGs are well suited for use in portable and wearable electronic devices.

The TENGs include two electrodes, each of which comprises an active layer comprising cellulose and a contact layer, which is an electrically conducting layer in electrical communication with the active layer. The cellulose in each of the two active layers has a different electron affinity, which results in a transfer of charges when the active layers come into contact. In the TENGs, the two electrodes are configured to be moved with respect to one another, after they make initial contact, in a manner that generates a periodically varying electric potential difference between their contact layers. The motion that generates the periodic potential difference can be, for example, a vertical motion that brings the two active layers into and out of contact (as in a vertical contact mode TENG) or a sliding motion that slides the two active layers into and out of contact (as in a sliding mode TENG). When the contact layers of the positive and negative active layers are connected across an external load, the periodically varying potential difference can be used to drive an alternating electric current through that load.

The active layers are triboelectrically active and electrically insulating. The "positive" active layer is so called because it has a lower electron affinity than the "negative" active layer and, therefore, acquires a positive surface charge via electron transfer when the two active layers are brought into contact. Similarly, the "negative" active layer is so called because it has a higher electron affinity than the "positive" active layer and, therefore, acquires a negative surface charge via electron transfer when the two active layers come into contact.

The cellulose of the positive action layer, the negative active layer, or both is treated so that it comprises chemical functional groups that alter the electron affinity of the cellulose. These functional groups may be incorporated into the cellulose by, for example, incorporating molecules comprising the functional groups into the cellulose of the active layer without chemical bonds, or they may be incorporated by reacting the cellulose with molecules comprising the functional groups to form chemically bonded chemical functionalities on the cellulose. Using methods such as those illustrated in the Examples, the chemical functional groups can be incorporated deep enough into the cellulose of the active layers to change the bulk electric properties of the active layers. As such, the resulting layer of chemically modified cellulose can be distinguished from layers of cellulose that are only modified at their outer surfaces using such methods as plasma surface modification. This is significant because TENGs require intimate contact between the positive and negative active layers and the friction between the two layers can wear away the surface over time. Therefore, the incorporation of the chemical functional groups deeper into the active layers can significantly extend the life of a TENG. Although the optimal thickness of the active layers may vary, the active layers typically have thicknesses in the range from about 10 µm to a few mm. This includes active layers having a thickness in the range from about 50 µm to about 1 mm.

Figure 2:
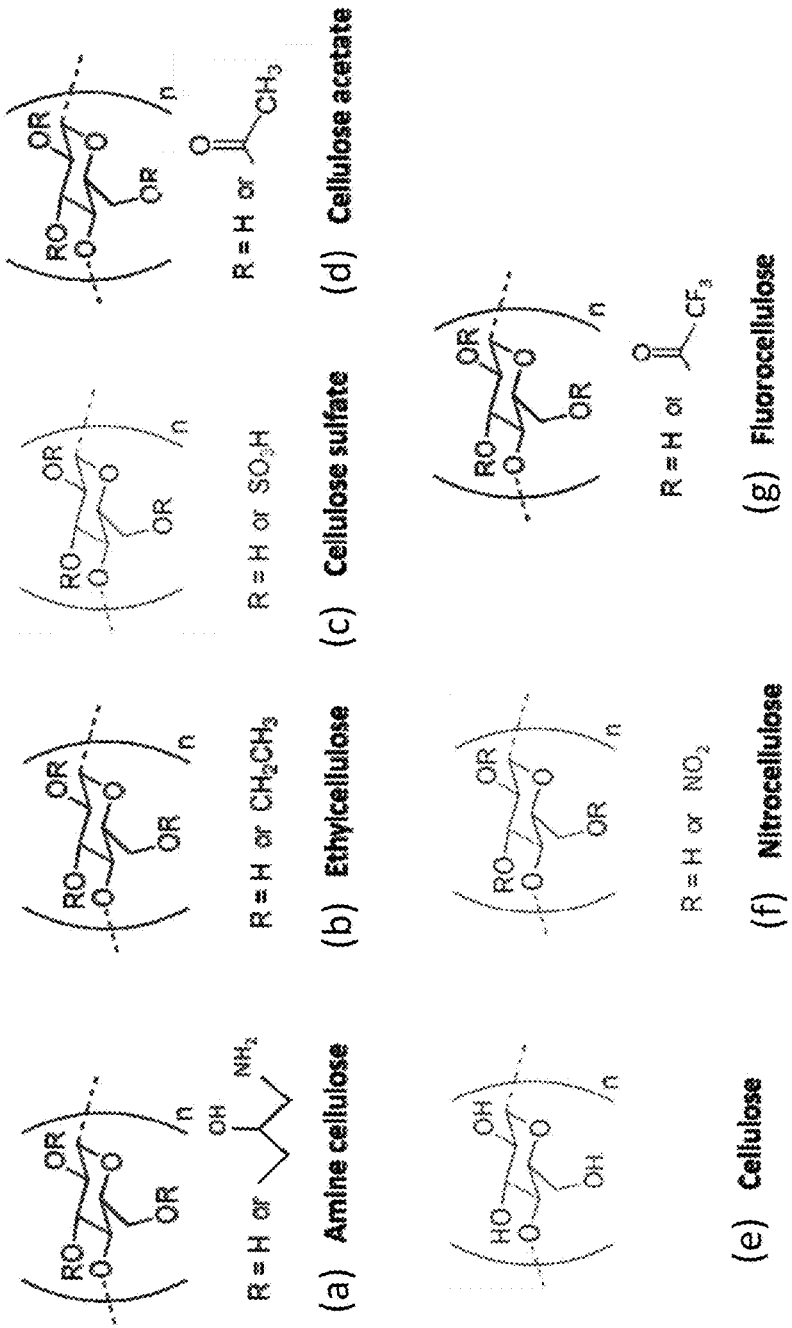
FIG. 2. Chemical structures of amine-, ethyl-, sulfate-, and acetate-functionalized cellulose, as well as unfunctionalized cellulose and nitro- and fluoro-functionalized cellulose.

The chemical functional groups incorporated into the active layers can be electron donating groups or electron withdrawing groups. Examples of electron donating groups include amine groups, methyl groups, ethyl groups, sulfate groups, acetate groups, and combinations thereof. The structures of amine-, ethyl-, sulfate-, and acetate-functionalized cellulose, as well as unfunctionalized cellulose are shown in FIG. 2, panels (a) through (e). Examples of electron withdrawing groups include nitro groups, chlorine groups, fluorine groups, and combinations thereof. The structures of nitro- and fluoro-functionalized cellulose are shown in FIG. 2, panels (f) and (g). The chemical functional groups listed as electron donating groups above, can also be to functionalize both the positive and negative active layers, provided that the positive active layer is functionalized with a functional group that is more strongly electron donating. Similarly the chemical functional groups listed as electron withdrawing groups above can be used to functionalize both the positive and negative active layers, provided that the negative active layer is functionalized with a functional group that is more strongly electron withdrawing. By way of illustration, methyl groups can be used to functionalize the positive active layer or the negative active layer. However, in some embodiments of the TENGs, the positive active layer is functionalized with an electron donating group and the negative active layer is functionalized with an electron withdrawing group.

TENGs having a larger difference between the electron affinity of their positive active layer and their negative active layer can provide higher power densities. Therefore, for some applications it may be advantageous to treat the cellulose of both the positive and negative active layers to maximize this difference. By way of illustration only, the cellulose of the positive active layer can be chemically functionalized with at least one of amine groups, ethyl groups, or methyl groups and the cellulose of the negative active layer can be functionalized with at least of chlorine groups or fluorine groups.

The cellulose of the active layers can be characterized by its surface charge density. For the purposes of this disclosure, surface charge density can be measured after contact with a gold (Au) surface, as discussed in Example 2. Some embodiments of the positive active layer comprising a chemically treated cellulose have a surface charge density of at least +1 $pC/cm^2$ after contact with an Au surface. This includes embodiments of the positive active layer that have a surface charge density of at least +1.2 $pC/cm^2$ after contact with an Au surface and further includes embodiments of the positive active layer that have a surface charge density of at least +1.4 $pC/cm^2$ after contact with an Au surface. Some embodiments of the negative active layer comprising a chemically treated cellulose have a surface charge density of −1.5 $pC/cm^2$ or lower after contact with an Au surface. This includes embodiments of the negative active layer that have a surface charge density of −2 $pC/cm^2$ or lower after contact with an Au surface and further includes embodiments of the negative active layer that have a surface charge density of −2.5 $pC/cm^2$ or lower after contact with an Au surface.

In some embodiments of the TENGs the cellulose in the positive and/or negative active layer is present as one component in a lignocellulosic material, where a lignocellulosic material refers to a plant-based material comprising the cellulose, along with hemicelluloses and lignin. The lignocellulosic material may be a natural material, such as wood, that has undergone some minimal mechanical processing, but otherwise retains its natural wood composition. Wood chips, which include shavings and sawdust, and materials comprising wood chips and, optionally, a binder and other additives, are examples of materials comprising natural lignocellulosic materials. Alternatively, the lignocellulosic material may have undergone chemical processing to selectively extract and purify its cellulose component. Examples of such materials include fiberboards, including recycled fiberboards. Fiberboards comprise plant-extracted cellulose fibers, which may be obtained from wood and other plant matter by, for example, bleaching and pulping. Highly purified cellulose nanofibrils (CNFs) are another example of a processed, plant extracted material that may be used as the cellulose of the active layers in the TENGs. CNFs comprise both amorphous and crystalline cellulosic domains and are characterized by nanoscale widths and microscale lengths. These fiber-like cellulose particles are generally characterized by lengths in the range from about 100 to about 5,000 nm; widths in the range from about 5 to about 200 nm; and corresponding aspect ratios in the range from about 2 to about 1,000. CNFs are sometimes referred to as nanocellulose fibrils (NFC) or nanofibers. CNFs have high surface areas, can be functionalized with a variety of chemical groups, and can be formed into optically transparent films. As used herein, the phrase optically transparent means transparent in the visible region of the electromagnetic spectrum.

The first and second contact layers are electrically conducting layers that are in electrical communication through one or more external loads, as discussed in greater detail below. They comprise an electrically conducting material, which may be a metal, such as gold, or a conducting oxide, such as indium tin oxide (ITO), or a carbon-base material, such as graphite. The contacts are typically, but not necessarily, deposited as thin films on the back surfaces of their respective active layers. The contact layers can be disposed on a support substrate, such that at least a portion of the contact layer is sandwiched between the support substrate and the active layer. The support substrates are desirably comprised of thin, flexible materials, such as polymers. Examples of suitable polymer supports include polyethylene naphthalate, polyethylene terephthalate (PET), polyimide, or poly-ether-ether-ketone.

Figure 1B:
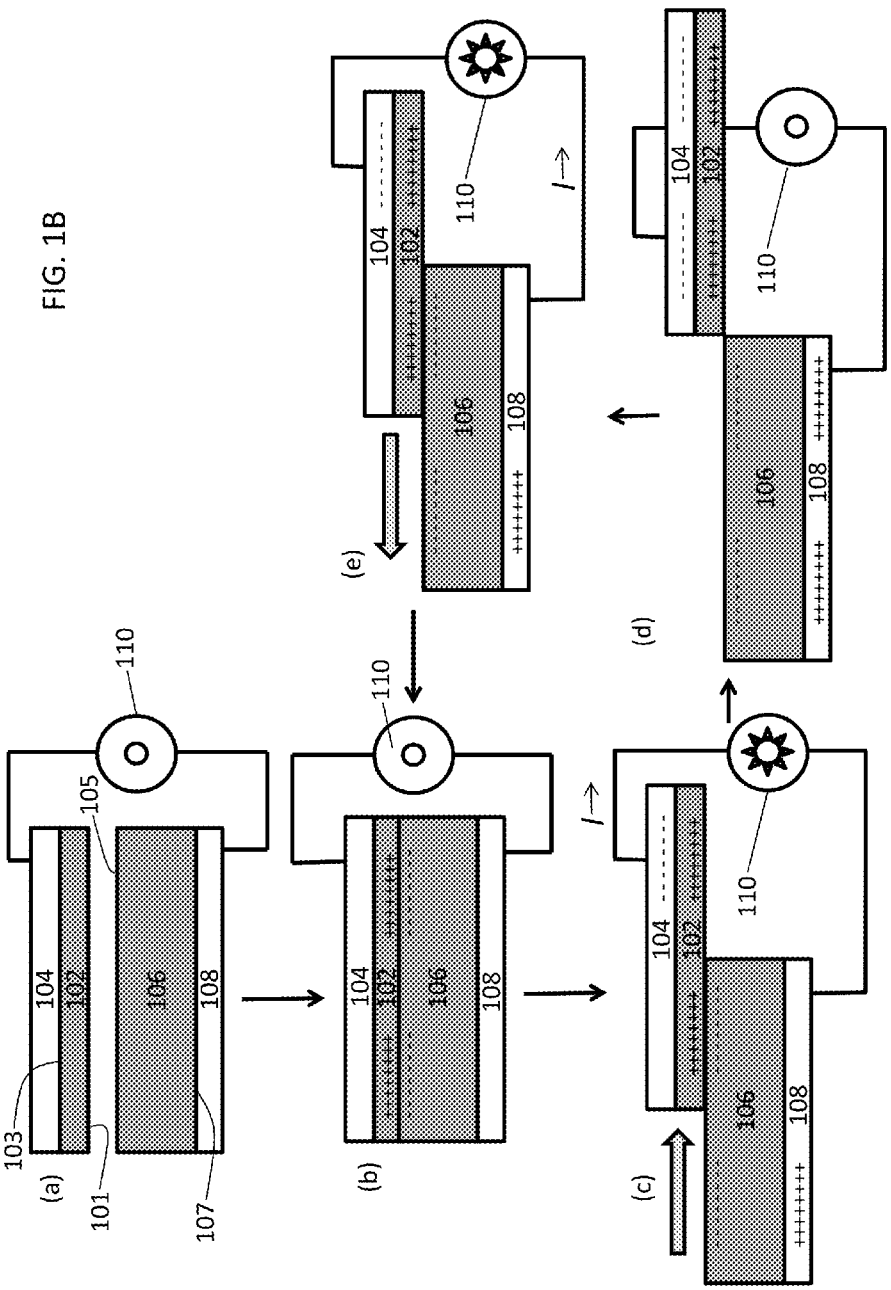
FIG. 1B. Schematic diagram showing a cyclic sliding force being applied to a lateral sliding mode TENG.

Examples of TENGs are shown in the schematic diagrams of FIG. 1A and FIG. 1B. FIG. 1A depicts one embodiment of a vertical contact mode TENG that includes: (a) a positive active layer 102 comprising cellulose, the positive active layer having a front surface 101 and an oppositely facing back surface 103; (b) a first contact layer 104 on back surface 103 of positive active layer 102 (together, layers 102 and 104 provide a first electrode); (c) a negative active layer 106 comprising cellulose, the negative active layer having a front surface 105 and a back surface 107, wherein negative active layer 106 has a higher electron affinity than positive active layer 102; and (d) a second contact layer 108 on back surface 107 of negative active layer 106 (together layers 106 and 108 provide a second electrode). An external load 110 is connected across first and second contact layers 102, 106, such that first and second contact layers 104, 108 are in electrical communication through external load 110. Front surface 101 of positive active layer 102 is disposed opposite and facing front surface 105 of negative active layer 106, such that the front surface of the positive active layer and the front surface of the negative active layer are separated by a gap 112 when the triboelectric nanogenerator is in an uncompressed state. In the TENG, the cellulose of at least one of the positive and negative active layers comprises a chemical functional group that provides the negative and positive active layers with different electron affinities.

The front surfaces of the positive and negative active layers face each other, but are separated by a gap when the TENG is in an uncompressed state. Further, the TENG is configured such that the positive and negative active layers can go from the uncompressed state, to a compressed state in which their front surfaces are in contact, and back to an uncompressed state in a series of compression cycles. Thus, the positive and negative active layers may be connected to one another via a flexible, elastic connector. Alternatively, one or both of the active layers may serve as, or be mounted to, a moveable platform that brings the two active layers into contact when a compressive force is applied.

The operation of a vertical contact mode TENG is illustrated schematically in FIG. 1A. Initially, the TENG is in an uncompressed state (panel (a)) in which the positive active layer and the negative active layer are not in contact and a potential difference has not yet been generated between the first and second contact layers. (Although the positive active layer is disposed above the negative active layer in FIGS. 1A-1C, these positions can be reversed.) A compressive force is then repeatedly applied to one or both of the positive and negative active layers and then released. The initial application of the compressive force brings the front surfaces of the positive and negative active layers into contact, as shown in panel (b). Due to their differing triboelectric properties, electrons from the positive active layer are injected into to negative active layer. This results in the accumulation of a positive surface charge on the positive active layer and a negative surface charge on the negative active layer. When the compressive force is released, the two active layers separate, creating a potential difference between the first and second contact layers (panel (c)). As a result, electrons flow from the second contact layer, through the external load, and into the first contact layer. Here, the external load is illustrated by an LED, which is lit by the current. This current stops once the potentials of the first and second contact layers are equalized (panel (d)). The compressive force is then reapplied, bringing the positive and negative active layers back into contact, whereby the electrons transferred to the first contact layer regenerate a potential difference between the first and second contact layers (panel (e)). This induces a reverse flow of electrons from the first contact layer, through the external load, and into the second contact layer, wherein the current lights up the LED. This reverse current flow is discontinued when the potentials of the first and second contact layers are equalized (f). The release/compress cycle can be repeated by cycling repeatedly through the steps illustrated in panels (b) through (e) in FIG. 1A.

The compressive force can occur at regular intervals or irregular intervals and may be generated by a wide variety of sources, including a person walking, running, or breathing, or by the vibrations of an engine or the rotation of a tire.

The TENGs can also be operated in a sliding mode, including a lateral sliding mode and a rotational sliding mode. In a sliding mode TENG, a periodic change in the contact area between the front surfaces of the positive and negative active layers results in a periodic lateral separation of the charge carriers. This creates a periodic potential difference between the two active layers that can be used to drive an external load.

The operation of a lateral sliding mode TENG is illustrated in FIG. 1B. The components of the TENG are the same as those for the vertical contact mode TENG of FIG. 1A. Once the positive and negative active layers are initially formed, their front surfaces are placed in contact in a manner that maximizes their contact surface area. The positive and negative active layers are configured such that their front surfaces are able to slide over one another, such that the active layers can go from a state of high contact area to a state of low (or no) contact area and then back to a state of high contact area in a series of sliding cycles. Thus, the positive and negative active layers may be connected to one another via a flexible, elastic connector. Alternatively, one or both of the active layers may serve as, or be mounted to, a moveable platform that laterally slides the front surface of one of the active layers with respect to the front surface of the other active layer. As in the vertical contact mode TENG, the first and second contact layers of the lateral sliding mode TENG are connected across an external load, which is powered by the TENG when the TENG is in operation.

In the sliding mode TENG of FIG. 1B, first contact layer 104 is in electrical communication with second contact layer 108 through external load 110 (depicted here as an LED) (panel (a)). In an initial contact position (panel (b)) the contact area of the front surface 101 of positive active layer 102 and the front surface 105 of negative active layer 106 is maximized. Due to their differing triboelectric properties, electrons from the positive active layer are injected into the negative active layer. This results in the accumulation of a positive surface charge on the positive active layer and a negative surface charge on the negative active layer. As a result, electrons flow from the second contact layer, through the external load, and into the first contact layer. Here, the external load is illustrated by an LED, which is lit by the current. This current stops once the potentials of the first and second contact layers are equalized (panel (d)). When a sliding force is applied to one or both of the active layers, positive active layer 102 slides outward with respect to negative active layer 106. The resulting decrease in the contact area between the two active layers results in an in-plane charge separation that creates a potential difference between the first and second contact layers (panel (c)). As a result, electrons flow from the first contact layer, through the LED and into the second contact layer, lighting up the LED. The sliding process continues until contact area between the front surfaces of the positive and negative active layers is eliminated, at which point the potential difference between the first and second contact layer disappears and the current stops flowing (panel (d)). The sliding direction is then reversed (panel (e)), regenerating the potential difference and causing electrons to flow in the reverse direction—from the second contact layer to the first contact layer—lighting up the LED. Once the contact area between the front surfaces of the positive and negative active layers is re-maximized (panel (b)), the potentials of the first and second contact layers are equalized and current flow ceases.

The sliding force can occur at regular intervals or irregular intervals and may be generated by a wide variety of sources, including a person walking, running, or breathing, or by the vibrations of an engine or the rotation of a tire.

The TENGs can also be operated in a freestanding triboelectric-layer mode. In a freestanding triboelectric-layer mode TENG, a periodic change in the position of the active layer of a mobile electrode relative to the active layers in a pair of stationary electrodes creates a periodic potential difference between the two stationary electrodes that can be used to drive an external load.

The operation of a lateral sliding mode TENG is illustrated in FIG. 1C. The freestanding triboelectric-layer mode TENG comprises a mobile electrode 111 comprising a positive active layer 102 comprising a layer of cellulose, a first stationary electrode 113, and a second stationary electrode 115 (i.e., a third electrode). Each of the first and second stationary electrodes has the same construction as the second electrode in FIG. 1A and comprises a negative active layer 106 comprising cellulose and a second contact layer 108 on the back surface of negative active layer 106. In an initial position (panel (a)) the positive active layer 102 of mobile electrode 111 is disposed directly over the negative active layer 106 of the first stationary electrode 113. As depicted in FIG. 1C, the cellulose in positive active layer 102 of mobile electrode 111 and the cellulose in negative active layer 106 of stationary electrode 113 have undergone a charge transfer, such that the former has a positive surface charge and the latter has a negative surface charge. The negative surface charge on the front surface of negative active layer 106 induces a positive charge on its back surface which, in turn, induces a negative charge in underlying contact layer 108.

When mobile electrode 111 slides laterally away from first stationary electrode 113, the charge balance is broken between them. That is, fewer electrons are needed in first stationary electrode 113 to balance the charge in mobile electrode 111. As a result, the induced negative charge in contact layer 108 of first stationary electrode 113 is reduced. Meanwhile, a positive charge is induced on the back surface of positive active layer 106 of second stationary electrode 115. This causes electrons to flow from contact layer 108 of first stationary electrode 113 to contact layer 108 of second stationary electrode 115, corresponding to a current flow from second stationary electrode 115 to first stationary electrode 113 (panel (b)). The charge flow is maximized when mobile electrode 111 is at the position fully overlapping second stationary electrode 115 (panel (c)). When mobile electrode 111 slides back toward first stationary electrode 113, electrons flow back from contact layer 108 of secondary stationary electrode 115 to contact layer 108 of first stationary electrode 113, corresponding to a reverse current flow from first stationary electrode 113 to second stationary electrode 115 (panel (d)). When mobile electrode 111 returns to its initial position directly overlying first stationary electrode 113 (panel (a)), all of the electrons resulting from the induced negative charge in the contact layers are driven back into contact layer 108 of first stationary electrode 113. This completes one AC current flow cycle through the external load 110 connected across first and second stationary electrodes 113, 115, via an external circuit. During the sliding of the mobile electrode, contact between the positive and negative active layer is not needed. Thus, the free-standing operation mode can largely reduce friction related damage to the active layers.

The sliding force that causes the mobile electrode to shift back-and-forth between the stationary electrodes can occur at regular intervals or irregular intervals and may be generated by a wide variety of sources, including a person walking, running, or breathing, or by the vibrations of an engine or the rotation of a tire.

The cyclic signal output of the TENGs is an alternating current (AC). However, it can be converted into a direct current (DC) by a rectification circuit. The load may comprise, for example, a battery, a capacitor, a sensor, such as a motion or vibration sensor, a light-emitting device, such as a light-emitting diode (LED), or a combination of one or more thereof.

The TENGs can be made by making a first electrode by forming a first active layer comprising cellulose, functionalizing the cellulose of the first active layer with one or more chemical functional groups that change the electron affinity of the cellulose relative to that of unfunctionalized cellulose, and forming a first contact layer on the back surface of the first active layer. The functionalization of the cellulose can take place prior to, or after, the active layer is formed. A second electrode can be made by forming a second active layer comprising cellulose and forming a second contact layer onto the back surface of the second active layer. The cellulose of the second active layer is either unfunctionalized or differently functionalized, such that it has a different electron affinity than the cellulose of the first active layer. The first and second active layers are then configured (i.e., designed) such that the front surface of the first active layer is disposed opposite and facing the front surface of the second active layer.

In some embodiments, the cellulose of the second active layer is also functionalized with one or more chemical functional groups that change the electron affinity of the cellulose relative to that of unfunctionalized cellulose. In such embodiments, the chemical functional groups incorporated into the first active layer impart the cellulose with a lower electron affinity, so that the first active layer serves as a positive active layer and the chemical functional groups incorporated into the second active layer impart the cellulose with a higher electron affinity, so that the second active layer serves as a negative active layer.

The cellulose can be functionalized, for example, by exposing the cellulose to a vapor comprising precursor molecules that include the chemical functional groups, wherein the precursor molecules infiltrate the first active layer and react with the cellulose to form the chemical functional groups in the cellulose. This method is illustrated in Example 1. Using this vapor infiltration approach, the doping of the active layer can extend well into the layer. By way of illustration, in some embodiments of the active layers, the chemical functional groups extend into the layer to a depth of at least 1 µm, starting from the front surface and any other exposed surface(s). This includes embodiments of the active layers in which the chemical functional groups extend into the layer to a depth of at least 2 µm and further includes embodiments of the active layers in which the chemical functional groups extend into the layer to a depth of at least 3 µm, starting from the front surface and any other exposed surface(s). The corresponding percentage of the active layer that is chemically functionalized at these depths will depend on the thickness of the active layer. However, in some embodiments of the active layers the chemical functional groups extend through at least 1% of the thickness of the active layer, starting from its front surface and any other exposed surface(s). This includes embodiments of the active layers in which the chemical functional groups extend through at least 2% of the thickness of the active layer, through at least 5% of the thickness of the active layer, through at least 20% of the thickness of the active layer, and through at least 50% of the thickness of the active layer, starting from its front surface and any other exposed surface(s). In some embodiments the active layers comprise the chemical functional groups all the way through their thickness.

The precursor molecules can be organic molecules or inorganic molecules comprising one or more chemical functional groups, including those discussed above, that are capable of altering the electron affinity of the cellulose. Typically the precursor molecules react with —OH groups on the cellulose to form chemical (e.g., covalent) bonds between the cellulose and the chemical functional groups. Optionally, the cellulose may be exposed to water vapor before or at the same time as it is exposed to the precursor molecules, in order to increase the density of reactive —OH groups on the cellulose. Examples of suitable precursor molecules for functionalizing cellulose with chlorine groups include $TiCl_4$, titanium isoporpoxide (TTIP), vanadium tetrachloride ($VOCl_3$), and vanadium oxytriisopropoxide (VTIP). Examples of suitable precursor molecules for functionalizing cellulose with methyl groups include trimethyl aluminum (TMA), tetrakis(ethylmethylamino)hafnium (Hf$(NEtMe)_4$), tetrakis(dimethylamino) hafnium (HRNMe$_2)_4$), and (dimethylamido)zirconium (Zr(NMe$_2)_4$). Examples of suitable precursor molecules for functionalizing cellulose with methyl groups include diethylzinc (DEZ). Examples of suitable precursor molecules for functionalizing cellulose with fluoro groups include $NH_4F$; hexafluoroacetylacetonate (HFAC)+ozone; anhydrous HF gas; $TiF_4$; and $TaF_5$. Examples of suitable precursor molecules for functionalizing cellulose with amino groups include bis(tert-butylamino)silane (BTBAS). Examples of suitable precursor molecules for functionalizing cellulose with nitro groups include nitrate-containing precursors: $Ti(NO_3)_2$, $Ni(NO_3)_2$, $Co(NO_3)_2$, $Cu(NO_3)_2$.

Alternatively, the cellulose can be functionalized in solution, prior to the formation of the active layer. As illustrated in Example 2, this can be done by forming an aqueous or non-aqueous solution comprising cellulose-containing fibers and chemical reactants that comprise the chemical functional groups and reacting the chemical reactants and the cellulose-containing fibers to provide chemical functional groups covalently bonded to the cellulose-containing fibers. (The step of reacting the chemical reactants and the cellulose-containing fibers can be merely allowing them to react under the conditions of the solution.) Functionalizing the cellulose prior to assembling it into an active layer has the advantage that the resulting active layer will comprise the functional groups throughout its thickness. The cellulose-containing fibers can be fibers of a lignocellulosic material or fibers extracted and purified from a lignocellulosic material, such as recycled fiberboard fibers.

EXAMPLE 1

This Example reports the implementation of CNF materials in TENG development. Flexible and transparent CNF thin films were paired with FEP (fluorinated ethylene propylene) and operated in the vertical contact-separation mode. The TENG device exhibited comparable performance to reported TENG counterparts built on synthetic polymers. The CNF-based TENG was also integrated with fiberboard made from recycled cardboard, creating a power board with high electric outputs using environmental-friendly wood-extracted materials.

Results and Discussion

The fabrication of CNF film started with the manufacturing of a CNF hydrogel, a process where wood pulp was oxidized and then mechanically homogenized according to Saito's method to achieve water dispersion of cellulose nanofibrils. (See, T. Saito, M. Hirota, N. Tamura, S. Kimura, H. Fukuzumi, L. Heux, A. Isogai, Biomacromolecules 2009, 10, 1992.) The CNF hydrogel was then filtered and dried under pressure to obtain transparent and flexible CNF thin films (detailed fabrication procedures are included in the method section). The thickness of the CNF films was controlled in the range of 70~320 µm by varying the amount of CNF hydrogel. The as-prepared CNF films exhibited a fairly smooth surface without any observable pin holes under low-magnification scanning electron microscope. The fibrous feature could be clearly observed by AFM topography scan. As shown in FIG. 3, a typical fiber had a diameter of 230 nm. The maximum height difference was approximately 300 nm, suggesting the surface roughness was ~300 nm. The as-prepared film also showed excellent transparency and flexibility. The film can be bent to a great degree and returned to its original shape after releasing it without showing any marks.

The CNF film was used as the positive active layer and paired with an FEP film as a negative active layer to assemble a TENG. FEP was chosen due to its very negative position on the triboelectric series (i.e. far from cellulose). The TENG device was built with an identical size (1 cm×1 cm) of both CNF and FEP films, each of its own flexible ITO/PET substrate, where ITO was the conducting electrode (i.e., contact layer) and PET was a support for the structure. The distance between the two ITO electrodes was fixed to be 1 mm for all experiments in this study. The schematic design is shown in FIGS. 1A-1C. A digital photo showed good transparency of the TENG device. In addition, in order to construct a TENG with all active materials made from CNF films, CNF films were treated by $TiCl_4$ exposures, which could introduce electron-giving —Cl groups into the film and make the CNF film more positive in the triboelectric series. The $TiCl_4$-treated CNF films were used to replace FEP and assembled together with pristine CNF films to fabricate all-CNF-based TENG devices.

The triboelectric performance of these two types of TENG devices (FEP/CNF and TiCl$_4$-treated CNF/pristine CNF) was studied by periodically pressing/releasing the top surface under a constant force and frequency. For comparison, a TENG was also made from two identical pristine CNF films and tested accordingly. FIG. 4A and FIG. 4B show typical open-circuit voltage ($V_{oc}$) and short circuit current ($I_{sc}$) output signals measured from the three types of CNF-based TENGs. For the device composed of CNF-FEP, the average peak values of the $V_{oc}$ and $I_{sc}$ reached ~5 V and ~5 μA, respectively. These values are comparable with the performance of TENGs made of typical synthetic polymer pairs such as Kapton-PET and PTFE-polyamide. (F.-R. Fan, Z.-Q. Tian, Z. Lin Wang, Nano Energy 2012, 1, 328 and Y. Yang, H. Zhang, R. Liu, X. Wen, T. C. Hou, Z. L. Wang, Advanced Energy Materials 2013, 3, 1563.) The TENG device built with TiCl$_4$-treated CNF films yielded ~3.5 V average $V_{oc}$ and ~0.35 μA average peak $I_{sc}$; whereas the outputs from two identical pristine CNF films only reached ~0.1V of average peak $V_{oc}$ and ~0.1 μA of average peak $I_{sc}$. This comparison clearly revealed that TiCl$_4$ vapor treatment is a very simple and effective strategy to tune the electron affinity of CNF. It proved the possibility of generating appreciable triboelectricity with both active layers being CNF, enabling a TENG device being completely built from biodegradable and green materials. Since the CNF-FEP pair exhibited the highest triboelectric performance among the three, in order to obtain the most responsive outcomes, TENG devices made from CNF-FEP pairs were used to further study and evaluate the CNF film influences in triboelectric behavior.

Figure 5A:
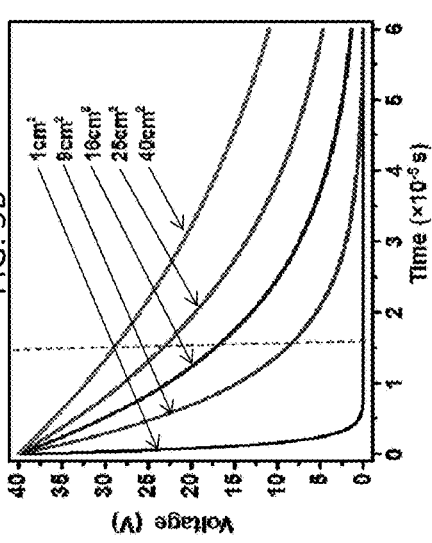
FIG. 5A. Measured voltage output (dots), calculated voltage output (circles), and measured triboelectric charge transfer (diamonds) as a function of active CNF film area (Aeff).

An interesting surface area-related $V_{oc}$ variation was observed when TENGs were made and tested from CNF/FEP films of five different surface areas in the range from 1 cm$^2$ to 40 cm$^2$. In this case, all TENGs had identical electrode spacing of 1 mm. As shown in FIG. 5A, $V_{oc}$ increased monotonically with the increasing of the active area. Testing of the $I_{sc}$ showed the same trend. The maximum $V_{oc}$ and $I_{sc}$ were 32.8 V and 35 μA, corresponding to 40 cm$^2$ surface area. However, the principle of TENG describes that the surface charge ($Q_0$) is directly proportional to effective surface area ($A_{eff}$) and the ratio between them ($Q_0/A_{eff}$) remains constant for a given TENG. This relationship tells us that $V_{oc}$ should be a constant as a function of $A_{eff}$ following the equation:

$$V = \frac{Q_0}{C_0} = \frac{Q_0 d}{A_{eff} \varepsilon}.$$

Figure 5B:
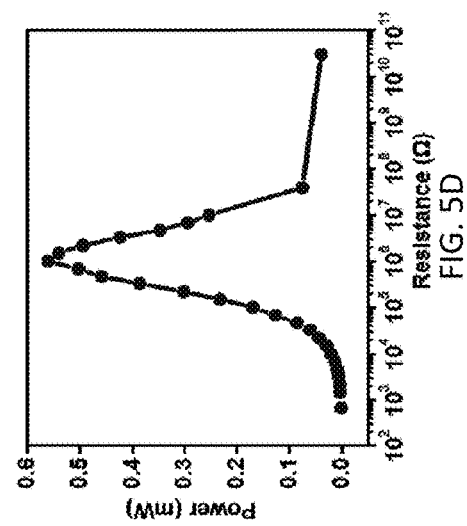
FIG. 5B. Calculated RC discharging curves for TENGs with different Aeff.

By examining the testing protocols, it was hypothesized that the voltage-surface area relation was likely a result of the discharging behavior of TENGs in an RC circuit, where the resistance of the oscilloscope is not infinitely large. Since C is directly related to $A_{eff}$, a larger area TENG has a larger time constant τ=RC. Therefore, given that all TENGs have the same initial $V_{oc}$, their V~t relationships were calculated and plotted (detailed calculation is included in the Supplementary Materials provided below). As shown in FIG. 5B, a TENG with larger $A_{eff}$ demonstrates a slower decaying curve. Considering the finite loading resistance (~1 MΩ) and data sampling rate (1.6×10$^{-5}$ s) of the oscilloscope, although initial $V_{oc}$ were the same for all TENGs, the $A_{eff}$-related voltage values could be recorded at any time t (t>0). The circles in FIG. 5A represent the calculated voltage values obtained at t=1.6×10$^{-5}$ s (as indicated by the dashed line in FIG. 5B), which demonstrated an excellent matching trend with respect to the experimental values. A corresponding charge measurement further confirmed the $A_{eff}$ relationship (diamonds in FIG. 5A). As the 40 cm$^2$ film demonstrated a high voltage output and $I_{sc}$, later experiments in this study all used films of 40 cm$^2$ surface areas, unless otherwise specified.

Figure 5C:
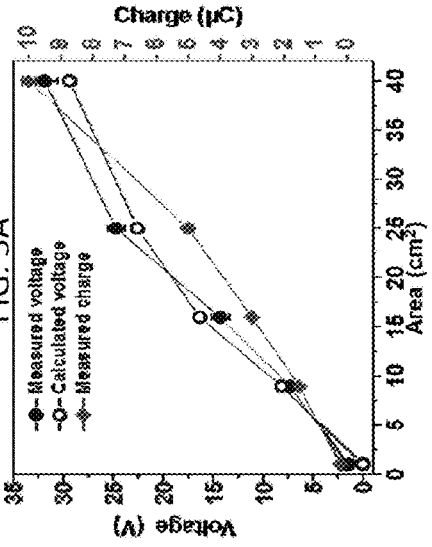
FIG. 5C. Voltage and current output of a TENG as a function of the load resistance.
Figure 5D:
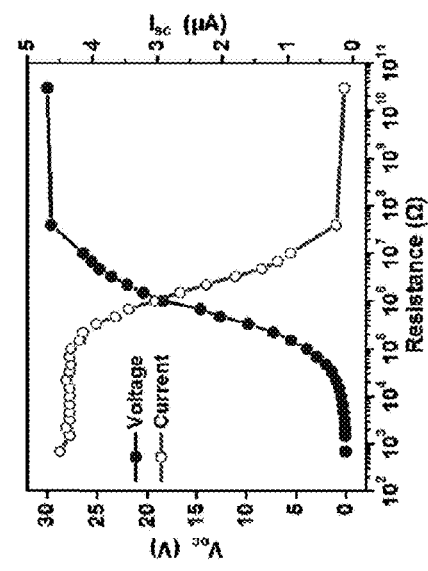
FIG. 5D. Calculated output power of a TENG as a function of the load resistance.

External load matching for the CNF TENG was carried out to further characterize its output performance. FIG. 5C shows the dependence of the peak $V_{oc}$ and $I_{sc}$ as a function of external load resistance measured from a TENG with a CNF film of 70 μm thickness and 40 cm$^2$ surface areas. Same as other TENGs, the $V_{oc}$ monotonically increased with the rising of the load resistance, while the $I_{sc}$ showed an opposite trend, as a result of ohmic loss. Corresponding power output was calculated from the product of $V_o$ and $I_{sc}$ and was plotted in FIG. 5D. The optimal power point was obtained at ~1 MΩ with a peak value of 0.56 mW. It should be noted that the power value presented here is the instantaneous peak power, corresponding to the short and sharp voltage and current peaks. Analyzing the amount of electrical energy produced would be a more practical approach to evaluate its applicant potential.

Figure 6A:
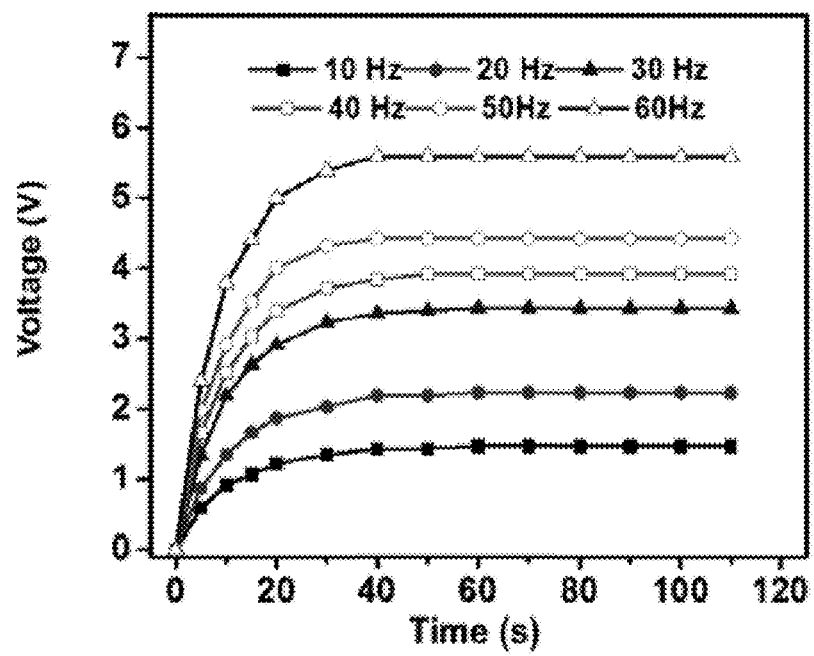
FIG. 6A. Voltage measured across a 10 µF capacitor when it was charged by a TENG under different frequencies of mechanical impacts.
Figure 6B:
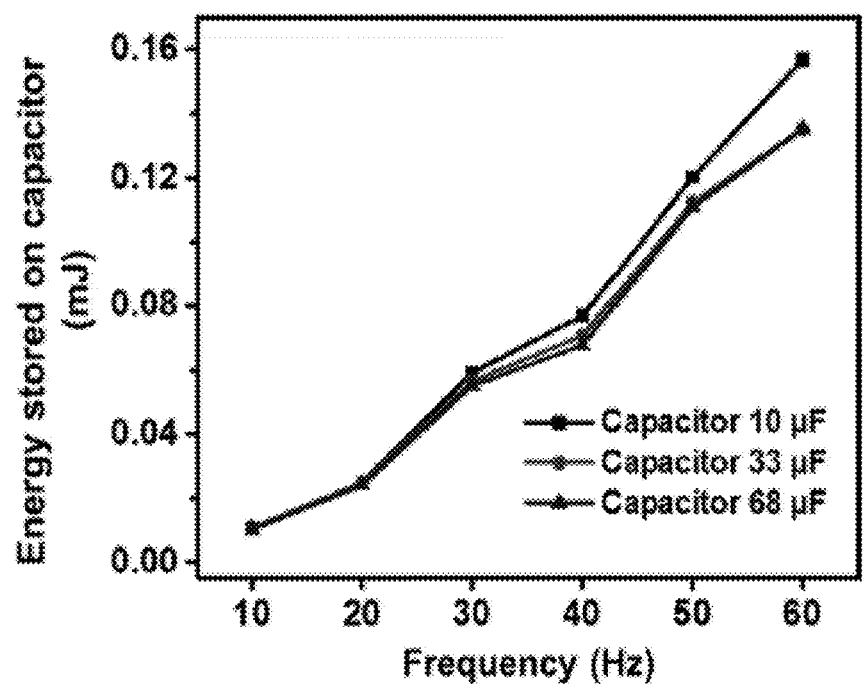
FIG. 6B. The energy stored in a capacitor calculated from the capacitor charging curves as a function of mechanical impact frequency. The TENG was successfully used as a direct current power source to light up 150 green LEDs connected in series.

In this regard, the CNF TENG was used to charge capacitors, so as to explore its potential as a continuous direct current (DC) energy supply. The experiments were conducted with the TENG connected to the capacitor through a rectification circuit, which converted the alternative current (AC)-type electric output into one direction. When the TENG was under continuous impacts with different frequencies, the voltage across the capacitor was measured every 5 seconds for a total of 110 seconds. Typical voltage raising profiles across a 10 μF capacitor are shown in FIG. 6A. A saturation charging curve was obtained after ~40 s operation, which is typical for resistor-capacitor (RC) charging. The charging of larger capacitors, e.g. 33 μF and 68 μF capacitors, exhibit similar behavior, while a larger capacitor requires a longer time to reach the saturation voltage. Further observation revealed that a higher frequency gave rise to a higher saturation voltage. It should be the result of the equilibrium established between the TENG's charging rate and the capacitor's leakage rate. Based on the charging curves, the energy (E) stored in the capacitor was calculated following the equations: E=CU$^2$/2, where C is the capacitance and U is the saturation voltage. The result of the calculations was plotted in FIG. 6B. With the increase of frequency within the studied range, the output energy raised monotonically from 0.01 to 0.16 mJ. Very little variation in the energy output was observed among the three different capacitors. Since the measurements showed that the minimum output occurred at the lowest frequency (10 Hz), the feasibility of the TENG as a power source for LEDs at this lowest frequency was tested. The TENG was able to light up 150 green LEDs connected in series, proving its capability as a practical DC power source.

Figure 7A:
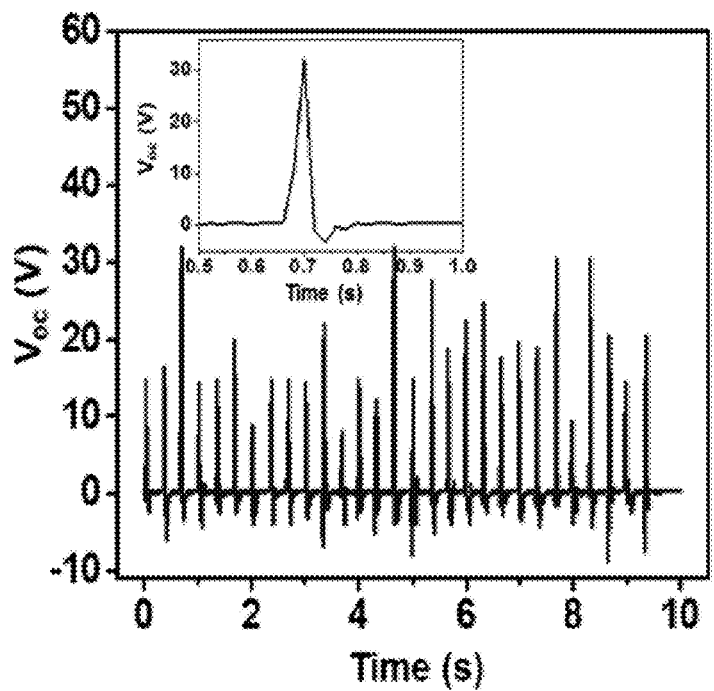
FIG. 7A. Open-circuit voltage (Voc) output of a triboelectric fiberboard when a person of normal weight stepped on repeatedly for ~30 times. Inset is the Voc during one stepping.
Figure 7B:
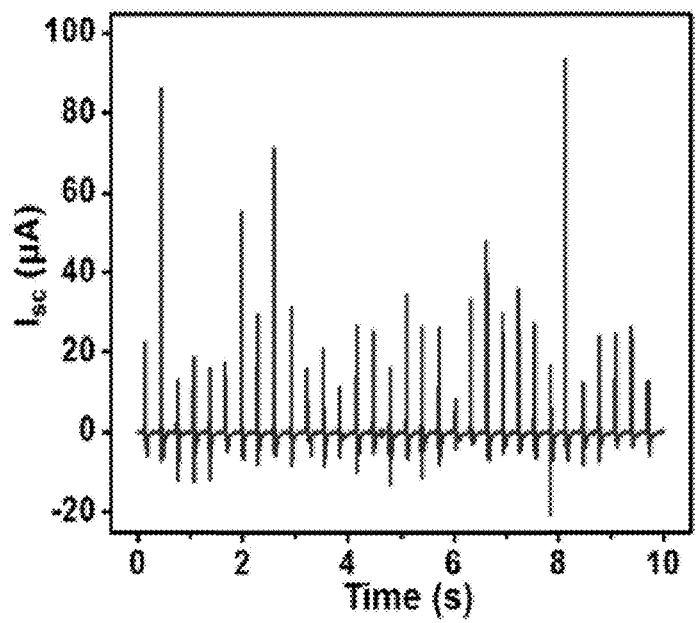
FIG. 7B. Short-circuit current (Isc) output of the triboelectric fiberboard when a person of normal weight stepped on repeatedly for ~30 times.

Considering that one major application of wood-extracted fibers is all kinds of board, the successful development of TENGs using CNF films allows for the creation of powering boards that are made from the same green and biodegradable nature materials. To demonstrate this concept, a CNF-based TENG was integrated with fiberboard made from recycled cardboard. An 8 cm×8 cm CNF TENG with all peripheries sealed was embedded in the wet fibers that were recovered from cardboard. These raw fibers were then formed into fibermat by vacuum sucking and further hardened by cold pressing at 100 MPa for 1 hour. After drying at 65° C. under 50 lb weight for 24 h, a fiberboard was obtained with a typical dimension of 20 cm in diameter and 4 mm in thickness. To demonstrate the powering capability of this TENG-integrated fiberboard, a person of normal weight repeatedly stepped on the fiberboard and corresponding electric output was monitored. As shown in FIG. 7A and FIG. 7B, the peak $V_{oc}$ and $V_{sc}$ ranged between ~10-30 V and ~10-90 µA, respectively, due to the irregular stepping force and speed. More practically, one single step on this fiberboard could easily light up 35 green LEDs connected in series, demonstrating the ability to power commercial electronics. By solving charge output based on a triple-capacitor model (FIG. 8), it was found that the power board could output up to 98% triboelectric charge to the external circuit, revealing a very high internal efficiency of charge output. The conversion efficiency from input mechanical energy to output electrical energy was calculated to be ~8.3%. The relatively low energy conversion efficiency might be due to the input mechanical energy being mostly stored as a mechanical deformation, due to the rigidity of the fiberboard itself.

Methods

Fabrication of CNF Film: Firstly, a CNF hydrogel was prepared from wood pulp by tetramethylpiperidine-1-oxy (TEMPO)-mediated oxidation and subsequent mechanical homogenization following the method from Saito et al. (See, T. Saito, M. Hirota, N. Tamura, S. Kimura, H. Fukuzumi, L. Heux, A. Isogai, Biomacromolecules 2009, 10, 1992.) Commercially supplied, bleached kraft eucalyptus pulps were oxidized in a mixture of TEMPO, sodium hypochlorite (NaClO), and sodium chlorite (NaClO$_2$) under pH 6.8. The oxidation was carried out at 60° C. for 48 h. Oxidized pulps were thoroughly washed in distilled water and refined in a disk refiner to break apart the residual fiber bundles. The refined fibers were then separated by centrifuge to remove the supernatant fraction, and concentrated to 1 wt. % using ultrafiltration. Finally, this suspension was subjected to high pressure mechanical homogenization by passing through a series of 200- and 87-µm chambers on a microfluidizer three times (M-110EH-30 Microfluidizer, Microfluidics, Newton, Mass., USA). The resulting mixture of nanofibrils and water formed a transparent, stable aqueous colloid system (with a cellulose solid weight of 1%), i.e., CNF hydrogel. To obtain the flexible and transparent CNF film, the as-processed CNF hydrogel was diluted with deionized (DI) water and then filtered under approximately 0.55 MPa air pressure in a filtration system (Millipore Corporation, USA). In the filtration chamber, water within the slurry passed through a polytetrafluoroethylene membrane (0.1 µm pore sizes), leaving the CNF filter cake. After separation from the membrane, the CNF cake was sandwiched between layers of waxy coated paper, filter paper, and caul plates for room temperature drying followed by 65° C. oven drying. During drying, pressure was applied on top by weights to prevent warping and wrinkling. Consequently, the flat, transparent and flexible CNF film was obtained.

Assembly of CNF Film TENGs: The TENGs used in demonstrating the design and performance of CNF TENGs were fabricated as follows: a pure CNF film with a size of 1 cm×1 cm was attached to the center of an indium tin oxide/polyethylene terephthalate (ITO/PET) substrate (2 cm×5 cm), which was considered as the top electrode. The bottom electrode was composed of another polymer film with the same size and location on the other ITO/PET substrate. The bottom polymer film can be fluorinated ethylene propylene (FEP), TiCl$_4$ treated CNF, or pristine CNF. The TiCl$_4$ treated CNF was obtained by 30 cycles of TiCl$_4$ vapor exposure in an atomic layer deposition (ALD) system. Each cycle of TiCl$_4$ exposure lasted 5 seconds and was separated from its subsequent TiCl$_4$ exposure by 60 seconds of N$_2$ purging. The two electrodes were 1 mm separated using spacers, and connected to the external circuit through copper tapes. The thickness of the bottom CNF was 320 µm, while the thickness of the FEP, top CNF and TiCl$_4$ coated CNF were all 60 µm. The TENGs used in external resistor matching and capacitor charging were assembled with a CNF film and an FEP film of 40 cm$^2$ active area. The thickness of the CNF was 70 µm, and the FEP 60 µm. The size of the substrate was 7.4 cm×10 cm.

Manufacturing of Power Fiberboard: Fibers recovered from cardboard were dispersed in water and formed a uniform mixture by mechanical stirring. The mixture was forced through a screen by vacuum sucking, leaving a wet mat. An 8 cm×8 cm CNF TENG with all peripheries sealed was embedded in the wet mat during vacuum sucking. Subsequently, the mat was sandwiched between release papers and coil plates, and sent to cold pressing under a pressure of 100 MPa for 1 h. The obtained mat was then dried for 24 h at 65° C. under a 50 lb weight to obtain the triboelectric fiberboard. The diameter of the product was ~20 cm and the thickness was ~4.5 mm. The top surface of the CNF TENG was 1.5 mm below the top surface of the final fiberboard product.

Characterizations and measurements: A LEO 1530 Gemini field emission scanning electron microscope (SEM) and a Park AFM XE70 system were used to characterize the morphology and surface features of the CNF films. Performance of the CNF TENGs was characterized by applying a periodical force. The top electrode was pressed down to reach the bottom electrode by a computer controlled shaker at a frequency of 10 to 60 Hz, and the bottom electrode was anchored on a lab bench. Performance of the triboelectric fiberboard was measured when a person of normal weight stepped on and off it. The voltage output was measured using an Agilent DSO1012A oscilloscope, and the current output and charge transfer were measured by an Autolab PGSTAT302N station.

Supplementary Materials:

Calculations for plotting of voltage output vs. active area Peak $V_{oc}$ occurs at the maximum separation while the electrodes are disconnected (or connected with a very large resistor). It is known that the open circuit voltage of TENG remains the same when increasing the active area $A_{\it eff}$, as $Q_0/A_{\it eff}$ term in potential difference equation $$V_{oc} = \frac{Q_0}{C_0} = \frac{Q_0 d}{A_{\it eff} \varepsilon}$$

is constant for a given TENG.

However, V would decrease after reaching the peak value $V_{oc}$ due to the discharging behavior of the capacitor: in a RC circuit, the governing equation is $$C\frac{dV}{dt} + \frac{V}{R} = 0;$$

and the voltage decreases following $$V(t) = V_0\left(e^{-\frac{t}{\tau}}\right),$$

where $\tau$=RC.

Figure 8:
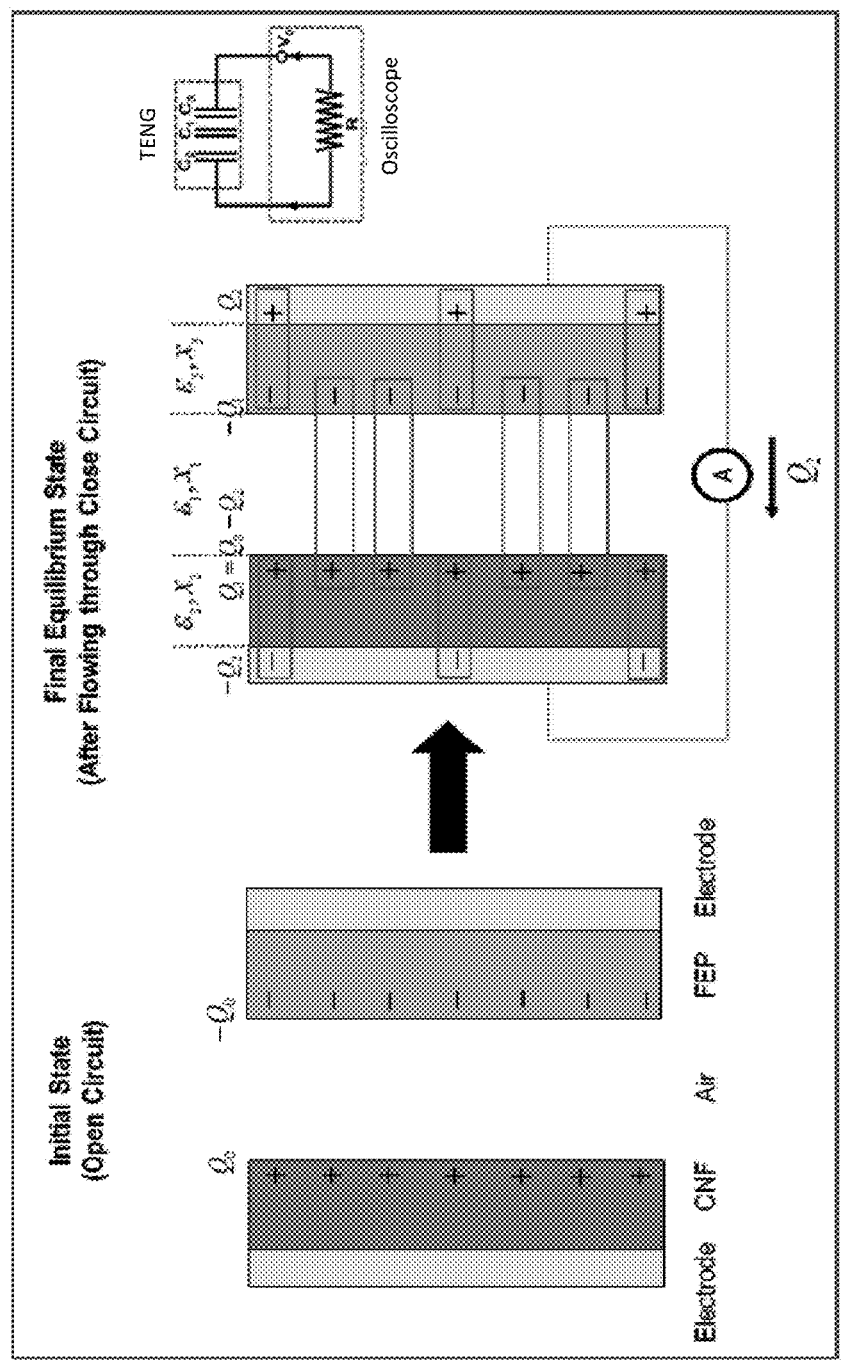
FIG. 8. Schematic diagram showing the initial state and the equilibrium state of a CNF-based TENG in the process of charge transfer. The TENG as a capacitor is identical to three capacitors connected in series: CNF film, air gap, and FEP film. To the left of the final equilibrium state is the identical circuit of the TENG system during voltage measurement.

As shown in FIG. 8, TENG as a capacitor is identical to three capacitors connected in series. So the capacitance of the TENG can be calculated according to the equation:

$$C = \frac{1}{\frac{1}{C_1} + \frac{1}{C_2} + \frac{1}{C_3}},$$

where $C_1$, $C_2$ and $C_3$ are the capacitance of the corresponding air capacitor, CNF capacitor, and FEP capacitor.

Plug $$C = \frac{A_{eff}\varepsilon}{d}$$

to $C_1$, $C_2$ and $C_3$ in the above equation and you obtain:

$$C = \frac{1}{\frac{1}{C_1} + \frac{1}{C_2} + \frac{1}{C_3}} = \frac{1}{\frac{d_1}{A_{eff}\varepsilon_1} + \frac{d_2}{A_{eff}\varepsilon_2} + \frac{d_3}{A_{eff}\varepsilon_3}}$$

$$= A_{eff} \frac{\varepsilon_1\varepsilon_2\varepsilon_3}{d_1\varepsilon_2\varepsilon_3 + d_2\varepsilon_1\varepsilon_3 + d_3\varepsilon_1\varepsilon_2}$$

$$= A_{eff} \frac{1\times10^{-12}\times 3\times10^{-12}\times 2.1\times10^{-12}}{82\times10^5\times 3\times10^{-12}\times 2.1\times10^{-12} + 7\times10^5\times 1\times 10^{-12}\times 2.1\times10^{-12} + 11\times10^5\times 1\times10^{-12}\times 3\times10^{-12}} \left(\frac{F}{m^2}\right)$$

$$= A_{eff} \times 0.01116\times10^{-7}\left(\frac{F}{m^2}\right)$$

In these experiments, the active area of the TENG is separately:
$A_{eff\text{-}a}$=1×10$^{-4}$ m$^2$, $A_{eff\text{-}b}$=9×10$^{-4}$ m$^2$, $A_{eff\text{-}c}$=16×10$^{-4}$ m$^2$, $A_{eff\text{-}d}$=25×10$^{-4}$ m$^2$, $A_{eff\text{-}e}$=40×10$^{-4}$ m$^2$ Plug these area values into the capacitance equation to get the corresponding capacitance of the TENG:
$C_a$=1.116×10$^{-13}$ F, $C_b$=10.044×10$^{-13}$ F, $C_c$=17.856×10$^{-13}$ F, $C_d$=27.9×10$^{-13}$ F, $C_e$=44.64×10$^{-13}$ F The resistance, R, in the circuit was 10MΩ. Therefore, the RC time constants $\tau$ in the circuit with corresponding TENG of area A are:
$\tau_a$=$RC_a$=1.116×10$^{-6}$ s, $\tau_b$=$RC_b$=10.044×10$^{-6}$ s, $\tau_c$=$RC_c$=17.856×10$^{-6}$ s, $\tau_d$=$RC_d$=27.9×10$^{-6}$ s, $\tau_e$=$RC_e$=44.64×10$^{-6}$ s Assuming the initial voltage (open circuit voltage) $V_0$ of the TENGs has a value somewhere in the normal range, say 40V, the voltage will decrease from discharge as time extends, and satisfy the equation $$V(t) = V_0\left(e^{-\frac{t}{\tau}}\right) = 40\left(e^{-\frac{t}{\tau}}\right).$$

The plotting of V vs. t for TENGs of different area was shown in FIG. 5B.

The oscilloscope collected data at a sampling rate of ~1.6×10$^{-5}$ s/sample. Therefore, with this ~1.6×10$^{-5}$ s delay from the initial moment t=0, the voltage output of the TENGs was calculated to drop to 0.00004V, 8.13V, 16.32V, 22.54V, and 29.33V corresponding to TENGs of 1 cm$^2$, 9 cm$^2$, 16 cm$^2$, 25 cm$^2$, and 40 cm$^2$ active area.

Calculations of TENG Conversion Efficiency

Charge Output Efficiency

The maximum instantaneous power output, $P_{max}$, energy output, E, and charge transfer, Q, of the TENG in the stepping cycle which gave the voltage peak is:

$$P_{max} = \frac{V^2}{R} = \frac{32^2}{1\times10^6}\left(\frac{V^2}{\Omega}\right) = 1.024 \text{ mW}$$

$$E = \int_{0.66}^{0.72} Pdt =$$

$$\int_{0.66}^{0.72} \frac{V^2(t)}{R} dt = \frac{1}{R}\int_{0.66}^{0.72} V^2(t)dt = 22.6592\times 10^{-6} \text{ J} = 0.022 \text{ mJ}$$

$$Q = \frac{1}{R}\int_{0.66}^{0.72} V(t)dt = 8.4\times10^{-7} A.s = 8.4\times10^{-7} C$$

In one cycle, energy output from the TENG fiberboard equaled the energy difference between the initial state and the final state. This output energy was consumed by the resistor (oscilloscope), and became the above calculated energy E. The initial state was identical to one capacitor, while the final state equaled three capacitors.

Energy stored on a capacitor follows:

$$E_{capacitor} = \frac{Q^2 x}{2A\varepsilon},$$

therefore, the energy output of the TENG fiberboard was calculated as:

$$E = E_{output} = \frac{Q_0^2 x_1}{2A_{eff}\varepsilon_1} - \frac{(Q_0 - Q_2)^2}{2A_{eff}\varepsilon_1} - \frac{Q_2^2 x_2}{2A_{eff}\varepsilon_2} - \frac{Q_2^2 x_3}{2A_{eff}\varepsilon_3},$$

where $\varepsilon_1 = 1\times 8.8541878176\times 10^{-12}\left(\frac{F}{m}\right)$, $x_1 = 80\times 10^{-6}$ m, $\varepsilon_2 = 3\times 8.8541878176\times 10^{-12}\left(\frac{F}{m}\right)$, $x_2 = 80\times 10^{-6}$ m, $\varepsilon_3 = 2.1\times 8.8541878176\times 10^{-12}\left(\frac{F}{m}\right)$, $x_3 = 110\times 10^{-6}$ m.

Insert $E_{output}$=0.022×10$^{-3}$ J, $Q_2$=Q=8.4×10$^{-7}$ C to obtain: $Q_0$=8.53552×10$^{-7}$ C, which is the initial charges generated on the interfaces of the TENG fiberboard upon contact. Therefore, fraction of charges transferred out of the TENG fiberboard was:

$$\eta_1 = \frac{Q_2}{Q_0} = \frac{8.4\times 10^{-7} C}{8.54\times 10^{-7} C} = 98.36\%$$

Conversion Efficiency from Mechanical Energy to Electrical Energy

In a voltage output cycle, the input mechanical energy was estimated as:

$W_1 = F \times S = m \times a \times x_1 = 10 \times 0.333 \times 80 \times 10^{-6} J = 0.266$ mJ where m is an estimation of effective weight, obtained by reading the weight from a weight scale during a step; a is the acceleration speed during a step, calculated from the fact that a still foot 0.06 m above the surface of triboelectric fiberboard reached the surface in 0.6 s; $x_1$ is the space between the active layers within the TENG. The output energy E is 0.022mJ as shown above. Therefore, the ratio of input mechanical energy to output electrical energy was calculated to be:

$$\eta_2 = \frac{E}{W} = \frac{0.022 \text{ mJ}}{0.266 \text{ mJ}} = 8.3\%$$

EXAMPLE 2

This example illustrates solution-phase methods for synthesizing positive and negative active layers comprising cellulose nanofibrils and methods for characterizing the performance of TENGs made therefrom. The surface charge densities of the unfunctionalized cellulose and the various functionalized celluloses studied are shown in Table 1. The surface charge densities for some conventional polymeric active layer materials are also provided.

TABLE 1

| Type of Cellulose | Surface charge q (pC) per ~0.13 cm² contact area after contact with Au |
| --- | --- |
| Amine cellulose | ca. +1.5 |
| Ethylcellulose | +1.3 |
| Methylcellulose | ca. +1.3 |
| Nylon 6,6 | +1.2 |
| Cellulose sulfate | ca. +1 |
| Cellulose acetate | ca. +0.5 |
| Cellulose | +0.15 |
| Polyethylene terephthalate PET | −0.8 |
| Nitrocellulose | ca. −1.6 |
| Fluorocellulose | ca. −2.8 |
| Polytetrafluoroethylene PTFE (Teflon) | −2.8 |

These charge densities were cited in published literature: A semi-quantitative tribo-electric series for polymeric materials: the influence of chemical structure and properties. *Journal of Electrostatics* 62 (2004) 277-290. The data were either measured via the method described below, or estimated according to the qualitative triboelectric series. The measured charging data were obtained using multiple contacts on the polymer films. The contacts were made using a spherical gold probe of 0.2 cm diameter, and a planar polymer sample. The polymer specimens were either solvent cast or commercial materials. The thicknesses of the polymer specimens were in the range 0.02-44 mm. Experiments were carried out using approximately 1.5N contact force, and were in vacuum of better than $10^{-4}$ Torr. The charge density values reported were the average of cumulative contacts made at different locations along the polymer specimen. The number of contacts was 400.

Synthesis:

Amine Cellulose. CNFs were suspended in a 1 M NaOH solution (396 mL per 1 g cellulose). The reaction mixture was placed on a hot plate with continuous stirring. Once the solution temperature reached 60° C., a certain amount of epichlorohydrin (18 mmol per 1 g cellulose) was introduced into the solution to form the epoxide rings on the cellulose. The reaction was left at 60° C. for 2 hours with continuous stirring. Then, the cellulose suspension was washed by deionized water until the pH reached 12. The epoxide cellulose was collected from the water and then distributed in a 50% (w/v) sodium hydroxide solution (396 mL per 1 g cellulose). The reaction mixture was placed on a hot plate with continuous stirring. Once the solution temperature reached 60° C., 29.4% w/v ammonium hydroxide (15 mL per 1 g cellulose) was added to the solution to form primary amines on the cellulose surface. The reaction lasted for 2 hours with continuous stirring. Then the products were washed by deionized water multiple times until the pH reached 7. The final products were stored at 4° C. until further use.

Methylcellulose. One gram of CNFs was mercerized in 20 ml 50% NaOH solution for 1 h at room temperature (~23° C.). Then the cellulose was collected by centrifugation to remove the NaOH solution and washed with DI water for several times. The CNFs were added into 12 ml dimethyl sulfide solution (3 ml dimethyl sulfide in 9 ml acetone). After reaction for 2 hrs at room temperature, the system was washed with acetone and centrifuged repeatedly. The collected CNFs were dried at 60° C.

Nitrocellulose. To synthesize nitrocellulose, a nitration acid mixture was prepared by mixing 25 wt % $HNO_3$, 59.5 wt % $H_2SO_4$, and 15.5 wt % $H_2O$ at room temperature. Dried CNFs were immersed in the acid at room temperature for 2 hrs under stirring. 50 ml of acid was used for each gram of cellulose. After the reaction, CNFs were retrieved by washing the reactants with DI water and centrifugation for several cycles. Then the CNFs were distributed in DI water and boiled twice for 1.5 hr each time. The CNFs were then washed twice using DI water containing 0.027% of sodium carbonate. After centrifugation and drying at 60° C., the nitrocellulose was distributed in ethyl acetate, and the nitrocellulose film was obtained after the volatilization of ethyl acetate in atmosphere at room temperature.

Surface Potential Measurements:

The surface potential of pristine and chemically treated cellulose films were measured by Kelvin probe microscopy (KPM). KPM mapping revealed that untreated (pristine) cellulose had an average surface potential of ~−360 mV; amine cellulose had a surface potential of −420 mV; methylcellulose showed a very positive surface potential of ~2V; and nitrocellulose showed a surface potential of ~−400 mV.

Figure 9A:
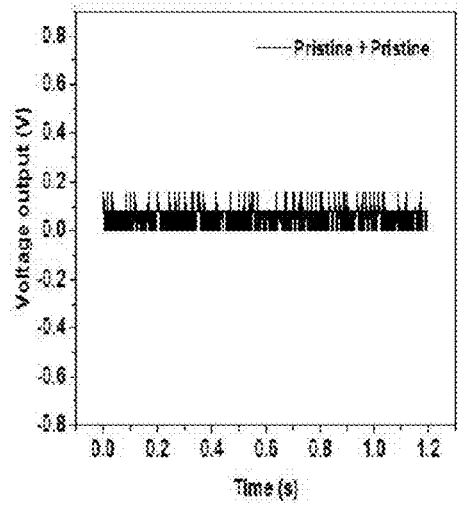
FIG. 9A. Triboelectric output from a cellulose pair composed of two pristine (unfunctionalized) cellulose films.
Figure 9B:
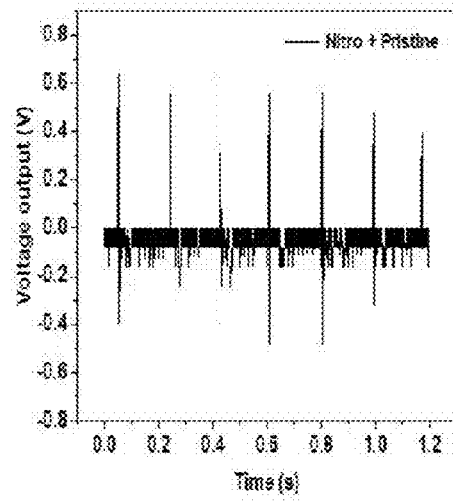
FIG. 9B. Triboelectric output from a cellulose pair composed of a nitro group-containing and a pristine cellulose film.
Figure 9C:
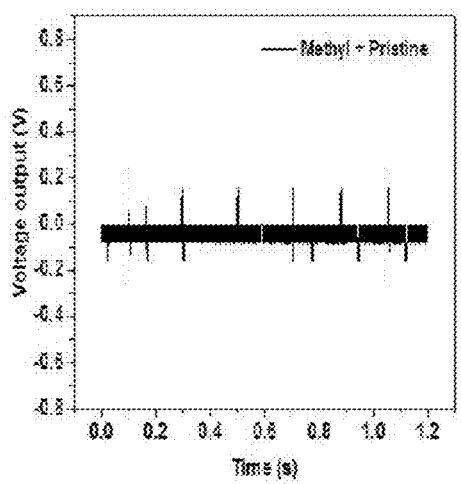
FIG. 9C. Triboelectric output from a cellulose pair composed of a methyl group-containing and a pristine cellulose film.
Figure 9D:
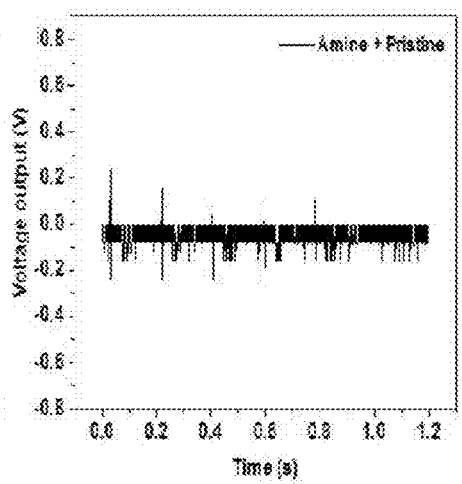
FIG. 9D. Triboelectric output from a cellulose pair composed of an amine group-containing and a pristine cellulose film.
Figure 9G:
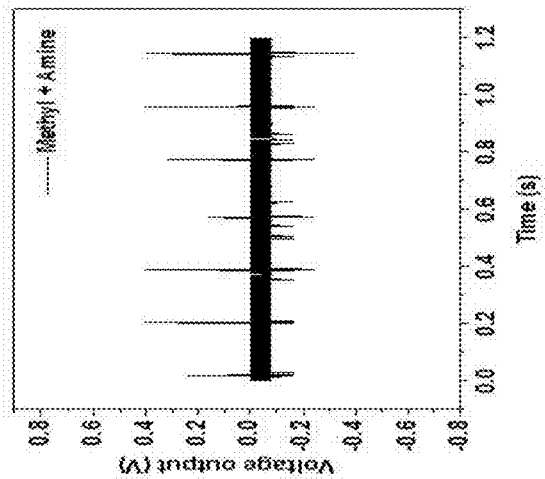
FIG. 9G. Triboelectric output from a cellulose pair composed of a methyl group-containing and an amine group-containing cellulose film.
Figure 9F:
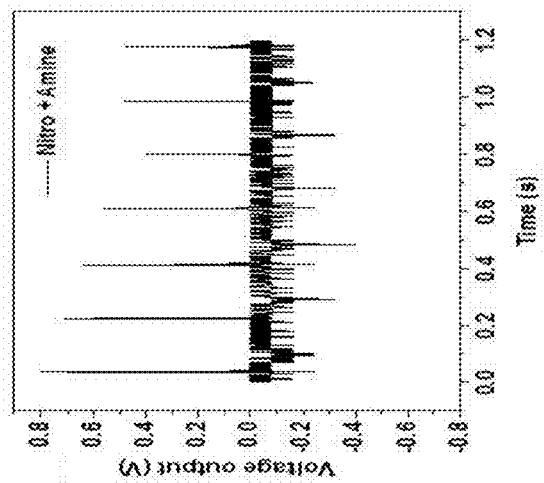
FIG. 9F. Triboelectric output from a cellulose pair composed of a nitro group-containing and an amine group-containing cellulose film.
Figure 9E:
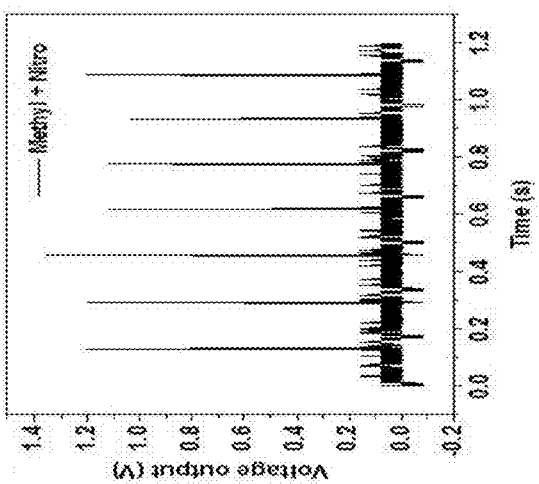
FIG. 9E. Triboelectric output from a cellulose pair composed of: a methyl group-containing and a nitro group-containing cellulose film.

Triboelectric Output Measurements:

The triboelectric output between different pairs of pristine and treated cellulose was measured based on the simple vertical contacting design. The outputs are shown in FIGS. 9A-9G. As expected, the output from a pair of pristine cellulose film was nearly negligible (FIG. 9A). The three chemically treated cellulose film all showed enhanced output in pair with the pristine cellulose film. Among them, Nitrocellulose exhibited the highest output (FIG. 9B), while the output from ethylcellulose and amine cellulose exhibited similar output, which was ~2 times smaller than that of the nitrocellulose (FIGS. 9C and 9D). When nitrocellulose was paired with methyl cellulose, the output was even doubled compared to the nitrocellulose-pristine cellulose pair (FIG. 9E). Similar significant output enhancement was also obtained from nitro-amine and methyl-amine pairs (FIG. 9F and FIG. 9G). The average peak voltages for the active layer pairs are listed in Table 2.

TABLE 2

| Functionalization of Cellulose Pairs in TENG | Average Peak Voltage Output (Volt) |
|---|---|
| Pristine + Pristine | 0.080 |
| Nitro + Pristine | 0.632 |
| Methyl + Pristine | 0.216 |
| Amine + Pristine | 0.188 |
| Methyl + Nitro | 1.102 |
| Nitro + Amine | 0.667 |
| Methyl + Amine | 0.376 |

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A triboelectric nanogenerator comprising:
a first electrode comprising a positive active layer comprising cellulose, the positive active layer having a front surface with a positive surface charge and an oppositely facing back surface;
a second electrode comprising a negative active layer comprising cellulose, the negative active layer having a front surface with a negative surface charge and an oppositely facing back surface;
a third electrode comprising a third active layer that is either a positive active layer comprising cellulose or a negative active layer comprising cellulose, the third active layer having a front surface with a positive surface charge if it is a positive active layer, or a negative surface charge if it is a negative active layer, and an oppositely facing back surface; wherein the positive active layer, the negative active layer, and the third active layer are dielectric layers;
a first electrically conducting contact layer on the back surface of one of the positive active layer, the negative active layer, or the third active layer;
a second electrically conducting contact layer on the back surface of another of the positive active layer, the negative active layer, or the third active layer; and
an external load connected across the first and second electrically conducting contact layers, such that the first and second electrically conducting contact layers are in electrical communication through the external load, wherein the front surface of each of the positive active layer, the negative active layer, and the third active layer is disposed opposite and facing the front surface of at least one other of the positive active layer, the negative active layer, and the third active layer, and further wherein the positive active layer, the negative active layer, and the third active layer are configured to be moved with respect to one another in a periodic manner that generates a periodically varying electric potential difference between the first electrically conducting contact layer and the second electrically conducting contact layer, and further wherein the cellulose of at least one of the positive active layer, the negative active layer, and the third active layer comprises a chemical functional group that provides the negative and positive active layers with different electron affinities.

2. The nanogenerator of claim 1, wherein the cellulose of at least one of the positive active layer, the negative active layer, and the third active layer comprises a chemical functional group independently selected from amine groups, methyl groups, ethyl groups, sulfate groups, acetate groups, nitro groups, fluoro groups, chloro groups, or a combination thereof.

3. The nanogenerator of claim 1, wherein the cellulose of the positive active layer comprises a first chemical functional group that provides the cellulose with a lower electron affinity than unfunctionalized cellulose, and the cellulose of the negative active layer comprises a second chemical functional group that provides the cellulose with a higher electron affinity than unfunctionalized cellulose.

4. The nanogenerator of claim 3, wherein the first chemical functional group is selected from amine groups, methyl groups, ethyl groups, sulfate groups, acetate groups, or a combination thereof, and the second chemical functional group is selected from nitro groups, fluoro groups, chloro groups, or a combination thereof.

5. The nanogenerator of claim 4, wherein the first chemical functional group is an amine group and the second chemical functional group is a fluoro group.

6. The nanogenerator of claim 1, wherein at least one of the positive active layer, the negative active layer, and the third active layer comprises a lignocellulosic material that comprises the cellulose and also comprises hemicelluloses and lignin.

7. The nanogenerator of claim 6, wherein the cellulosic material comprises a wood fiberboard.

8. The nanogenerator of claim 1, wherein at least one of the positive active layer, the negative active layer, and the third active layer is an optically transparent layer comprising cellulose in the form of cellulose nanofibrils.

9. The nanogenerator of claim 1, wherein the chemical functional groups are present from the front surface of the positive active layer, the negative active layer, or the third active layer through at least 1% of the thickness of the positive active layer, the negative active layer, or the third active layer.

10. The nanogenerator of claim 1, wherein the chemical functional groups are present throughout the thickness of the positive active layer, the negative active layer, or the third active layer.

11. A triboelectric nanogenerator comprising:
a positive active layer comprising cellulose, the positive active layer having a front surface and an oppositely facing back surface;
a negative active layer comprising cellulose, the negative active layer having a front surface and an oppositely facing back surface, wherein the positive active layer and the negative active layer are dielectric layers;

a first electrically conducting contact layer on the back surface of the positive active layer;

a second electrically conducting contact layer on the back surface of the negative active layer; and an external load connected across the first and second electrically conducting contact layers, such that the first and second electrically conducting contact layers are in electrical communication through the external load, wherein the front surface of the positive active layer is disposed opposite and facing the front surface of the negative active layer, and the positive and negative active layers are configured to be moved with respect to one another in a periodic manner that generates a periodically varying electric potential difference between the first electrically conducting contact layer and the second electrically conducting contact layer, and further wherein the cellulose of at least one of the positive and negative active layers comprises a chemical functional group that provides the negative and positive active layers with different electron affinities.

12. The nanogenerator of claim 11, wherein the cellulose of at least one of the positive active layer and the negative active layer comprises a chemical functional group independently selected from amine groups, methyl groups, ethyl groups, sulfate groups, acetate groups, nitro groups, fluoro groups, chloro groups, or a combination thereof.

13. The nanogenerator of claim 11, wherein the cellulose of the positive active layer comprises a first chemical functional group that provides the cellulose with a lower electron affinity than unfunctionalized cellulose, and the cellulose of the negative active layer comprises a second chemical functional group that provides the cellulose with a higher electron affinity than unfunctionalized cellulose.

14. The nanogenerator of claim 13, wherein the first chemical functional group is selected from amine groups, methyl groups, ethyl groups, sulfate groups, acetate groups, or a combination thereof, and the second chemical functional group is selected from nitro groups, fluoro groups, chloro groups, or a combination thereof.

15. The nanogenerator of claim 14, wherein the first chemical functional group is an amine group and the second chemical functional group is a fluoro group.

16. The nanogenerator of claim 11, wherein at least one of the positive active layer and the negative active layer comprises a lignocellulosic material that comprises the cellulose and also comprises hemicelluloses and lignin.

17. The nanogenerator of claim 16, wherein the cellulosic material comprises a wood fiberboard.

18. The nanogenerator of claim 11, wherein at least one of the positive active layer and the negative active layer is an optically transparent layer comprising cellulose in the form of cellulose nanofibrils.

19. The nanogenerator of claim 11, wherein the chemical functional groups are present from the front surface of the positive active layer or the negative active layer through at least 1% of the thickness of the positive active layer or the negative active layer.

20. The nanogenerator of claim 11, wherein the chemical functional groups are present throughout the thickness of the positive active layer or the negative active layer.

21. A method of converting mechanical energy into an electrical current using the nanogenerator of claim 1, the method comprising:

(a) applying a force to at least one of the positive active layer, the negative active layer, and the third active layer that moves the front surface of at least one of the positive active layer, the negative active layer, and the third active layer with respect to the front surface of at least one other of the positive active layer, the negative active layer, and the third active layer in a manner that generates a potential difference between the first and second electrically conducting contact layers, wherein electrons are transferred from one of the first and second electrically conducting contact layers, through the external load, and to the other of the first and second electrically conducting contact layers until the potentials of the first and second electrically conducting contact layers become equal;

(c) applying a reverse force to at least one of the positive active layer, the negative active layer, and the third active layer that moves the front surface of at least one of the positive active layer, the negative active layer, and the third active layer with respect to the front surface of at least one other of the positive active layer, the negative active layer, and the third active layer in a manner that regenerates a potential difference between the first and second electrically conducting contact layers, wherein electrons are transferred back from one of the first and second electrically conducting contact layers, through the external load, and to the other of the first and second electrically conducting contact layers until the potentials of the first and second electrically conducting contact layers become equal; and (d) repeating steps (b) and (c) a plurality of times.

22. A method of making a triboelectric nanogenerator, the method comprising:

forming a first electrode by:

forming a first active layer comprising cellulose on a substrate, the first active layer having a front surface and an oppositely facing back surface;

functionalizing the cellulose of the first active layer with one or more chemical functional groups that change the electron affinity of the cellulose relative to that of unfunctionalized cellulose; and forming a first electrically conducting contact layer on the back surface of the first active layer;

forming a second electrode by:

forming a second active layer comprising cellulose on a substrate, the second active layer having a front surface and an oppositely facing back surface, wherein the cellulose of the second active layer has a different electron affinity than the cellulose of the first active layer; and forming a second electrically conducting contact layer on the back surface of the second active layer;

and arranging the first active layer and the second active layer such that the front surface of the first active layer is disposed opposite and facing the front surface of the second active layer, and the first and second active layers are configured to be moved with respect to one another in a periodic manner that generates a periodically varying electric potential difference between the first electrically conducting contact layer and the second electrically conducting contact layer.

23. The method of claim 22, wherein functionalizing the cellulose of the first active layer with one or more chemical functional groups that change the electron affinity of the cellulose relative to that of unfunctionalized cellulose comprises exposing the cellulose to a vapor comprising precursor molecules that comprise the chemical functional groups, wherein the precursor molecules infiltrate the first active layer and react with the cellulose to provide chemical functional groups chemically bonded to the cellulose.

24. The method of claim 23, wherein the chemically bonded chemical functional groups extend from the front surface of the first active layer through at least 10% of the thickness of the first active layer.

25. The method of claim 22, wherein the cellulose of the first active layer is functionalized with the one or more chemical functional groups before the first active layer comprising the cellulose is formed.

26. The method of claim 25, wherein functionalizing the cellulose of the first active layer with the one or more chemical functional groups that change the electron affinity of the cellulose relative to that of unfunctionalized cellulose comprises forming a solution comprising cellulose-containing fibers and chemical reactants that comprise the chemical functional groups and reacting the chemical reactants with the cellulose-containing fibers to provide chemical functional groups covalently bonded to the cellulose-containing fibers.

27. The method of claim 22, wherein the first chemical functional groups provide the cellulose of the first active layer with a lower electron affinity than unfunctionalized cellulose.

28. The method of claim 22, wherein the first chemical functional groups provide the cellulose of the first active layer with a higher electron affinity than unfunctionalized cellulose.

29. The method of claim 27, further comprising functionalizing the cellulose of the second active layer with one or more chemical functional groups that provide the cellulose of the second active layer with a lower electron affinity than unfunctionalized cellulose.

* * * * *

UNITED STATES PATENT AND TRADEMARK OFFICE
CERTIFICATE OF CORRECTION

PATENT NO. : 10,277,147 B2
APPLICATION NO. : 15/178285
DATED : April 30, 2019
INVENTOR(S) : Xudong Wang et al.

Page 1 of 1

It is certified that error appears in the above-identified patent and that said Letters Patent is hereby corrected as shown below:

In the Specification

Column 11, Line 51:
Delete the phrase "(HRNMe$_2$)$_4$)," and replace with --(Hf(NMe$_2$)$_4$),--.

Column 14, Line 18:
Delete the phrase "V$_o$," and replace with --$V_{oc}$--.

Column 15, Line 9:
Delete the phrase "peak V$_{oc}$ and V$_{sc}$" and replace with --peak $V_{oc}$ and $I_{sc}$--.

Column 18, Line 41:
Delete the phrase "$E = E_{output} = \frac{Q_0^2 x_1}{2A_{eff}\varepsilon_1} - \frac{(Q_0-Q_2)^2}{2A_{eff}\varepsilon_1} - \frac{Q_2^2 x_2}{2A_{eff}\varepsilon_2} - \frac{Q_2^2 x_3}{2A_{eff}\varepsilon_3},$" and replace with --$E = E_{output} = \frac{Q_0^2 x_1}{2A_{eff}\varepsilon_1} - \frac{(Q_0-Q_2)^2 x_1}{2A_{eff}\varepsilon_1} - \frac{Q_2^2 x_2}{2A_{eff}\varepsilon_2} - \frac{Q_2^2 x_3}{2A_{eff}\varepsilon_3},$--.

Signed and Sealed this
Twenty-fifth Day of June, 2019

Andrei Iancu
*Director of the United States Patent and Trademark Office*